United States Patent
Ino et al.

(10) Patent No.: US 9,935,122 B2
(45) Date of Patent: Apr. 3, 2018

(54) NONVOLATILE SEMICONDUCTOR MEMORY DEVICE HAVING ELECTRON SCATTERING AND ELECTRON ACCUMULATION CAPACITIES IN CHARGE ACCUMULATION LAYER

(71) Applicant: Toshiba Memory Corporation, Minato-ku (JP)

(72) Inventors: Tsunehiro Ino, Fujisawa (JP); Daisuke Matsushita, Fujisawa (JP); Yasushi Nakasaki, Yokohama (JP); Misako Morota, Kawasaki (JP); Akira Takashima, Fuchu (JP); Kenichiro Toratani, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/071,475

(22) Filed: Mar. 16, 2016

(65) Prior Publication Data
US 2017/0077115 A1    Mar. 16, 2017

(30) Foreign Application Priority Data
Sep. 10, 2015 (JP) .................................. 2015-178908

(51) Int. Cl.
*H01L 27/115* (2017.01)
*H01L 29/51* (2006.01)
(Continued)

(52) U.S. Cl.
CPC .. *H01L 27/11582* (2013.01); *H01L 21/28282* (2013.01); *H01L 29/4234* (2013.01); *H01L 29/513* (2013.01)

(58) Field of Classification Search
CPC ......... H01L 27/11568; H01L 27/11582; H01L 29/513; H01L 29/518
See application file for complete search history.

(56) References Cited

U.S. PATENT DOCUMENTS

| | | | | |
|---|---|---|---|---|
| 2007/0252209 A1* | 11/2007 | Yamazaki | ........... | H01L 27/0207 257/347 |
| 2007/0281400 A1* | 12/2007 | Yamazaki | ......... | H01L 21/28273 438/151 |

(Continued)

FOREIGN PATENT DOCUMENTS

| JP | 2008-130743 A | 6/2008 |
|---|---|---|
| JP | 2008-211162 A | 9/2008 |

(Continued)

*Primary Examiner* — Thanh V Pham
(74) *Attorney, Agent, or Firm* — Oblon, McClelland, Maier & Neustadt, L.L.P.

(57) ABSTRACT

A nonvolatile semiconductor memory device according to an embodiment comprises a memory cell, the memory cell comprising: a semiconductor layer; a control gate electrode; a charge accumulation layer disposed between the semiconductor layer and the control gate electrode; a first insulating layer disposed between the semiconductor layer and the charge accumulation layer; and a second insulating layer disposed between the charge accumulation layer and the control gate electrode, the charge accumulation layer including an insulator that includes silicon and nitrogen, and the insulator further including: a first element or a second element, the second element being different from the first element; and a third element different from the first element and the second element.

14 Claims, 22 Drawing Sheets

(51) Int. Cl.
*H01L 27/11582* (2017.01)
*H01L 21/28* (2006.01)
*H01L 29/423* (2006.01)

(56) References Cited

U.S. PATENT DOCUMENTS

| | | | |
|---|---|---|---|
| 2008/0023744 A1* | 1/2008 | Shin | H01L 21/28282 257/298 |
| 2008/0116507 A1 | 5/2008 | Ino et al. | |
| 2008/0157092 A1* | 7/2008 | Arai | H01L 27/115 257/67 |
| 2008/0185635 A1 | 8/2008 | Yanagi et al. | |
| 2008/0237697 A1 | 10/2008 | Shimizu et al. | |
| 2009/0166710 A1 | 7/2009 | Shimizu et al. | |
| 2009/0194797 A1 | 8/2009 | Shimizu et al. | |
| 2009/0210772 A1* | 8/2009 | Noguchi | G06F 11/1068 714/764 |
| 2009/0236654 A1 | 9/2009 | Ishihara et al. | |
| 2009/0242958 A1 | 10/2009 | Kikuchi et al. | |
| 2009/0242970 A1 | 10/2009 | Shimizu et al. | |
| 2010/0052035 A1 | 3/2010 | Koike et al. | |
| 2010/0078704 A1 | 4/2010 | Ino et al. | |
| 2010/0224916 A1 | 9/2010 | Shimizu et al. | |
| 2010/0244157 A1 | 9/2010 | Hirano et al. | |
| 2010/0283098 A1 | 11/2010 | Yoshida et al. | |
| 2011/0049612 A1 | 3/2011 | Higuchi et al. | |
| 2011/0233655 A1 | 9/2011 | Shimizu et al. | |
| 2012/0146053 A1 | 6/2012 | Saitoh et al. | |
| 2013/0242977 A1 | 9/2013 | Tanaka | |
| 2015/0200307 A1* | 7/2015 | Matsuo | H01L 29/7926 257/326 |
| 2016/0155750 A1* | 6/2016 | Yasuda | H01L 27/11582 257/324 |

FOREIGN PATENT DOCUMENTS

| | | |
|---|---|---|
| JP | 2008-244243 A | 10/2008 |
| JP | 2009-10166 A | 1/2009 |
| JP | 2009-141248 A | 6/2009 |
| JP | 2009-164260 A | 7/2009 |
| JP | 2009-182207 A | 8/2009 |
| JP | 2009-231370 A | 10/2009 |
| JP | 2009-231844 A | 10/2009 |
| JP | 2009-239080 A | 10/2009 |
| JP | 2009-245958 A | 10/2009 |
| JP | 2010-16067 A | 1/2010 |
| JP | 2010-62387 A | 3/2010 |
| JP | 2010-87089 A | 4/2010 |
| JP | 2010-135561 A | 6/2010 |
| JP | 2010-212361 A | 9/2010 |
| JP | 2010-226037 A | 10/2010 |
| JP | 2010-263119 A | 11/2010 |
| JP | 2011-49239 A | 3/2011 |
| JP | 2011-171771 A | 9/2011 |
| JP | 2011-205046 A | 10/2011 |
| JP | 2012-124296 A | 6/2012 |
| JP | 2013-168673 A | 8/2013 |
| JP | 2013-191666 A | 9/2013 |

* cited by examiner

US 9,935,122 B2

NONVOLATILE SEMICONDUCTOR MEMORY DEVICE HAVING ELECTRON SCATTERING AND ELECTRON ACCUMULATION CAPACITIES IN CHARGE ACCUMULATION LAYER

CROSS-REFERENCE TO RELATED APPLICATIONS

This application is based upon and claims the benefit of priority from the prior Japanese Patent Application No. 2015-178908, filed on Sep. 10, 2015, the entire contents of which are incorporated herein by reference.

BACKGROUND OF THE INVENTION

Field of the Invention

Embodiments of the present invention relate to a nonvolatile semiconductor memory device.

Description of the Related Art

In the field of nonvolatile semiconductor memory devices, a three-dimensional type NAND type flash memory has been receiving attention as a device capable of achieving a high level of integration without being limited by a resolution limit of lithography technology. This three-dimensional type NAND type flash memory comprises a stacked body in which a plurality of conductive layers each functioning as a word line or select gate line and a plurality of inter-layer insulating layers are stacked alternately on a semiconductor substrate, and comprises a column shaped semiconductor layer disposed so as to penetrate this stacked body. This semiconductor layer functions as a channel of a memory cell. Moreover, the three-dimensional type NAND type flash memory comprises a block insulating layer, a charge accumulation layer, and a tunnel insulating layer disposed sequentially between the conductive layer and the semiconductor layer in the stacked body.

In the case of a three-dimensional type NAND type flash memory having the above-described structure, film thinning of the charge accumulation layer is conceivable as one of measures for reducing a cost of the memory. However, it becomes a problem that when the charge accumulation layer undergoes film thinning, its charge holding capacity and charge trapping efficiency lower.

SUMMARY OF THE INVENTION

A nonvolatile semiconductor memory device according to an embodiment comprises a memory cell, the memory cell comprising: a semiconductor layer; a control gate electrode; a charge accumulation layer disposed between the semiconductor layer and the control gate electrode; a first insulating layer disposed between the semiconductor layer and the charge accumulation layer; and a second insulating layer disposed between the charge accumulation layer and the control gate electrode, the charge accumulation layer including an insulator that includes silicon and nitrogen, and the insulator further including: a first element or a second element, the second element being different from the first element; and a third element different from the first element and the second element.

DETAILED DESCRIPTION OF THE EMBODIMENTS

Nonvolatile semiconductor memory devices according to embodiments will be described below with reference to the drawings.

First Embodiment

First, an overall configuration of a nonvolatile semiconductor memory device according to a first embodiment will be described.

Figure 1:
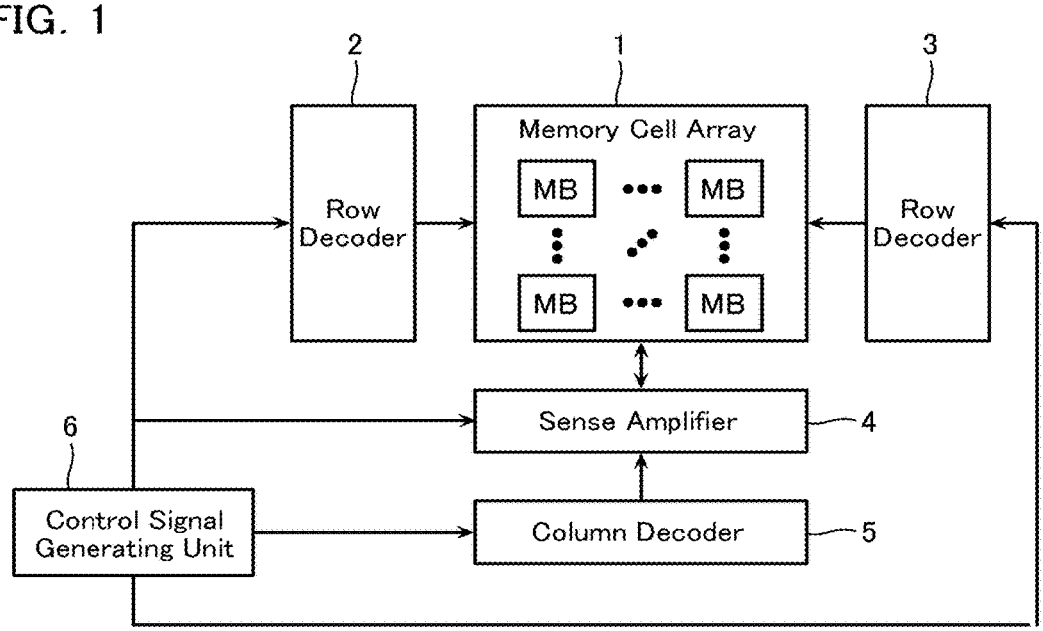
FIG. 1 is a view showing functional blocks of a nonvolatile semiconductor memory device according to a first embodiment.

FIG. 1 is a view showing functional blocks of the nonvolatile semiconductor memory device according to the present embodiment.

The nonvolatile semiconductor memory device according to the present embodiment comprises: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory cells MC arranged three-dimensionally therein. The row decoders 2 and 3 decode a downloaded block address signal, and so on, and control write and read of data of the memory cell array 1. The sense amplifier 4 detects and amplifies an electrical signal flowing in the memory cell array 1 during data read. The column decoder 5 decodes a column address signal and controls the sense amplifier 4. The control signal generating unit 6, in addition to boosting a reference voltage and generating a high voltage employed during data write or data erase, generates a control signal and controls the row decoders 2 and 3, the sense amplifier 4, and the column decoder 5.

Next, a circuit configuration of the memory cell array 1 of the present embodiment will be described.

Figure 2:
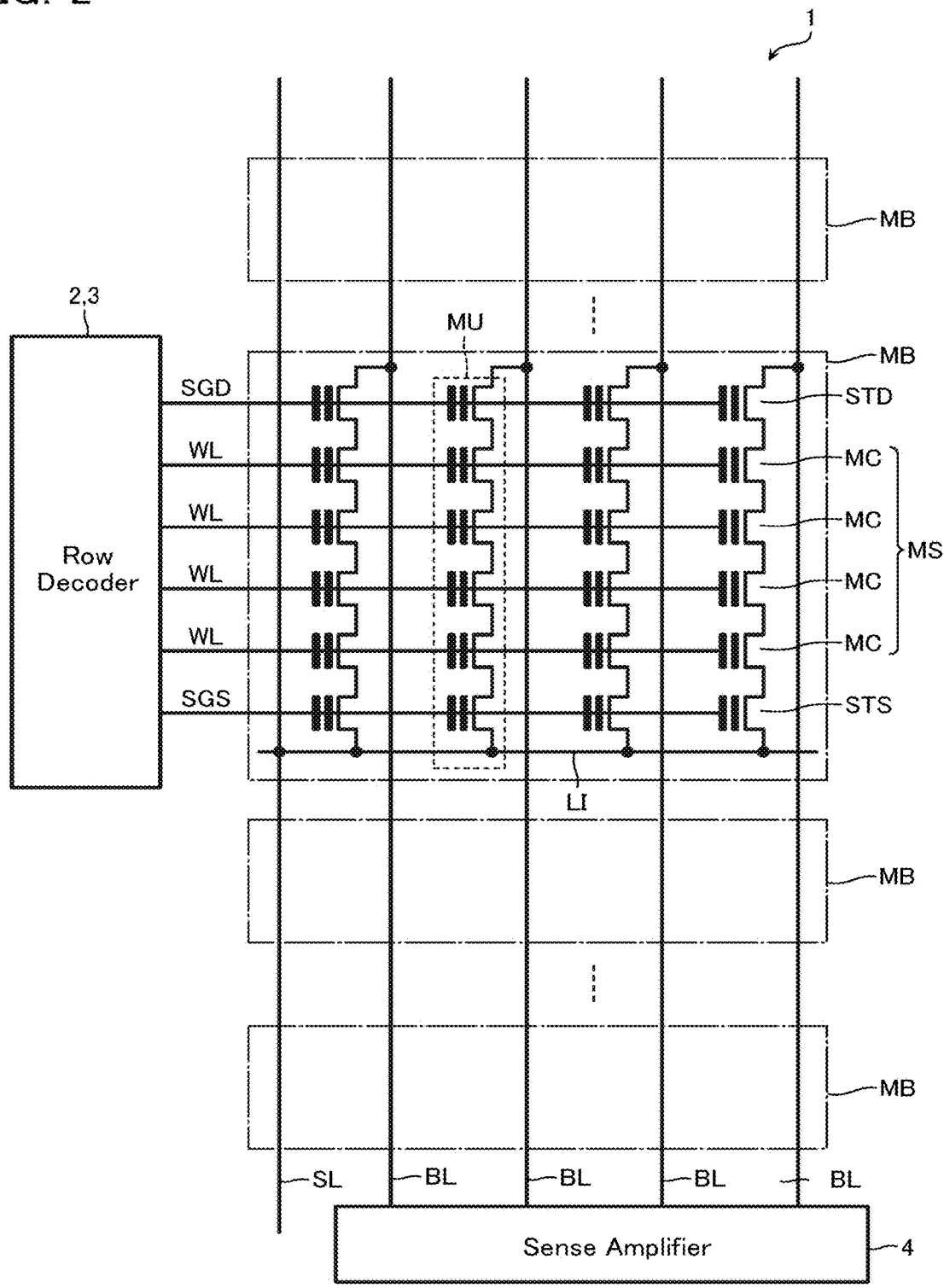
FIG. 2 is a view showing an equivalent circuit of a memory cell array in the nonvolatile semiconductor memory device according to the same embodiment.

FIG. 2 is a view showing an equivalent circuit of the memory cell array in the nonvolatile semiconductor memory device according to the present embodiment.

As shown in FIG. 2, the memory cell array 1 includes the plurality of memory blocks MB. Commonly connected to these plurality of memory blocks MB are a plurality of bit lines BL and a source line SL. Each of the memory blocks MB is connected to the sense amplifier 4 via the bit line BL, and is connected to an unillustrated source line driver via the source line SL.

Hereafter, a monoatomic layer means a layer configured by one layer of atoms in a plane. That is, the monoatomic layer results in a layer comprising a film thickness of approximately a one atom portion.

Moreover, a monolayer (ML) is the name of a unit "ML" that means, with respect to 1 monolayer being the number of atoms in an ideal (that is, zero defect) monoatomic layer, about what number of atoms exist, that is, a coverage factor in an actual monoatomic layer. For example, 0.5 monolayer is indicated by "0.5 ML" in graphs, and so on, and means atoms exist with a coverage factor of 50% with respect to an ideal (that is, zero defect) monoatomic layer.

In the present specification, a film of 1 monolayer or less is assumed to mean a monoatomic layer. Note that a film exceeding 1 monolayer will be a multiple atomic layer in which atomic layers are stacked. For example, when 1.5 monolayer is referred to, a 0.5 monolayer atomic layer exists on a 1 monolayer atomic layer. The lower layer 1 monolayer in this case need not necessarily be ideal (that is, zero defect), and it is rare for an actual atomic layer to be completely zero defect.

The memory block MB includes a plurality of memory units MU that have their one ends connected to the bit line BL and have their other ends connected to the source line SL via a source contact LI. Each of the memory units MU includes: a memory string MS; a source side select transistor STS connected between the memory string MS and the source contact LI; and a drain side select transistor STD connected between the memory string MS and the bit line BL.

The memory string MS includes a plurality of the memory cells MC connected in series. Each of the memory cells MC is a transistor having a semiconductor layer, a charge accumulation layer, and a control gate, and accumulates a charge in the charge accumulation layer based on a voltage applied to the control gate, thereby changing a threshold value of the memory cell MC. Commonly connected to a plurality of the memory cells MC belonging to different memory strings MS is a word line WL acting as an electrode of the control gate of the respective memory cells MC. These plurality of memory cells MC are connected to the row decoder 2 or 3 via the word line WL.

The source side select transistor STS has a control gate to which a source side select gate line SGS is connected. The source side select gate line SGS is connected to the row decoder 2 or 3, and selectively connects the memory string MS and a semiconductor substrate based on an inputted signal.

The drain side select transistor STD has a control gate to which a drain side select gate line SGD is connected. The drain side select gate line SGD is connected to the row decoder 2 or 3, and selectively connects the memory string MS and the bit line BL based on an inputted signal.

Next, a schematic structure of the memory cell array 1 of the present embodiment will be described.

Figure 3:
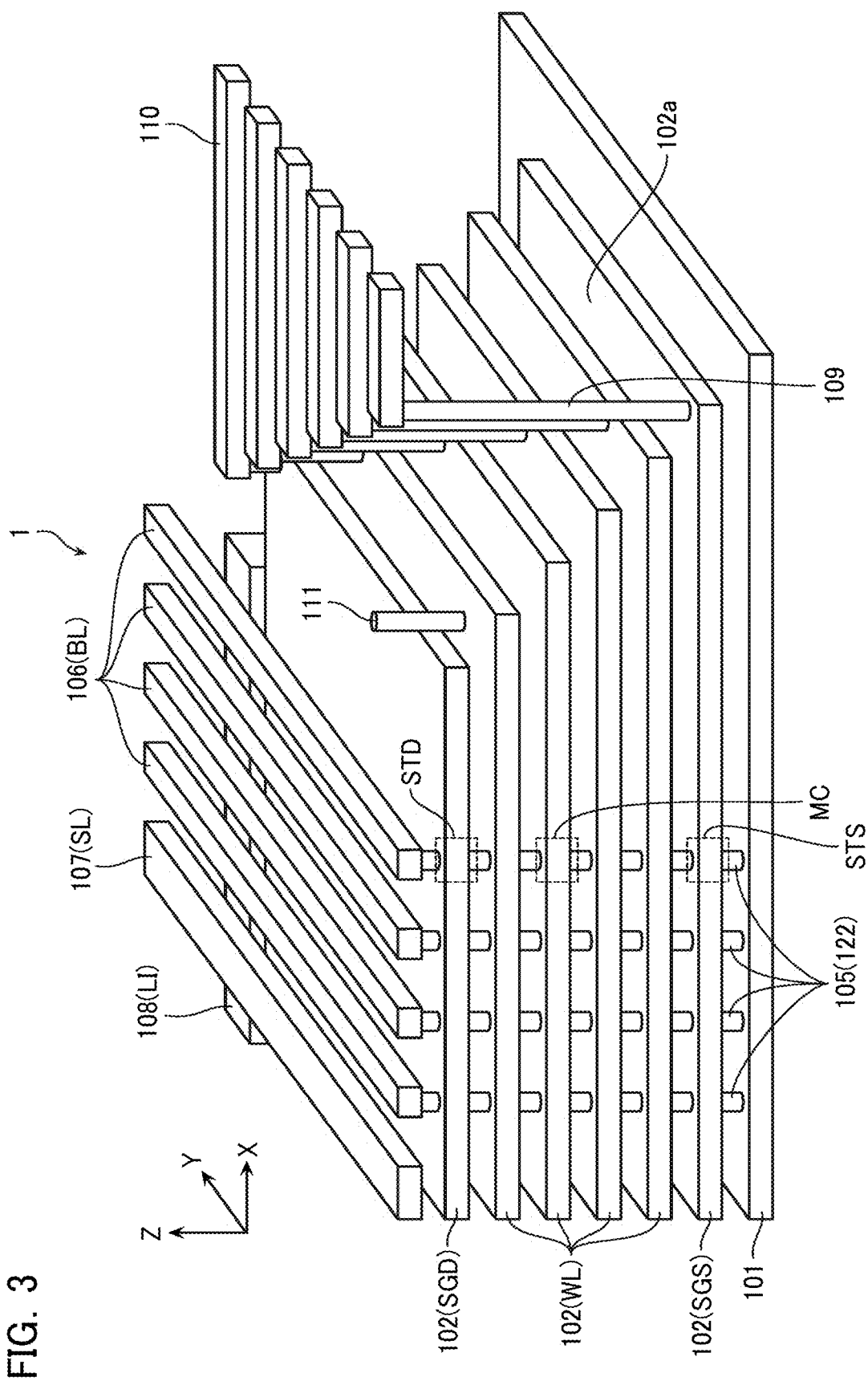
FIG. 3 is a perspective view showing a schematic structure of the memory cell array in the nonvolatile semiconductor memory device according to the same embodiment.

FIG. 3 is a perspective view showing the schematic structure of the memory cell array in the nonvolatile semiconductor memory device according to the present embodiment.

As shown in FIG. 3, the memory cell array 1 includes: a semiconductor substrate 101; and a plurality of conductive layers 102 (control gate electrodes) stacked in a Z direction on the semiconductor substrate 101.

The memory cell array 1 includes a plurality of memory columnar bodies 105 extending in the Z direction. An intersection of the conductive layer 102 and the memory columnar body 105 functions as the source side select transistor STS, the memory cell MC, or the drain side select transistor STD. The conductive layer 102 is formed by the likes of tungsten (W) or polysilicon (Poly-Si), for example, and functions as the source side select gate line SGS, the word line WL, and the drain side select gate line SGD.

Moreover, the plurality of conductive layers 102 are formed in steps. That is, a certain conductive layer 102 has a contact portion 102a that does not face a lower surface of another conductive layer 102 positioned in a layer above. Moreover, the conductive layer 102 is connected to a via 109 at this contact portion 102a. A wiring line 110 is disposed on an upper end of the via 109. Note that the via 109 and the wiring line 110 are formed from the likes of tungsten (W).

In addition, the memory cell array 1 includes a conductive layer 108 that faces side surfaces in a Y direction of the plurality of conductive layers 102 and extends in an X direction. A lower surface of the conductive layer 108 contacts the semiconductor substrate 101. The conductive layer 108 is formed from the likes of tungsten (W), for example, and functions as the source contact LI.

Moreover, the memory cell array 1 includes a plurality of conductive lines 106 and a conductive line 107 that are positioned above the plurality of conductive layers 102 and the memory columnar body 105, are aligned in plurality in the X direction, and extend in the Y direction. The memory columnar bodies 105 are respectively electrically connected to lower surfaces of the conductive lines 106. Note that the conductive line 106 is formed from the likes of tungsten (W), for example, and functions as the bit line BL. The conductive layer 108 is electrically connected to a lower surface of the conductive line 107. Note that the conductive line 107 is formed from, for example, tungsten (W), and functions as the source line SL.

Furthermore, the memory cell array 1 includes a beam columnar body 111. The beam columnar body 111 communicates with holes formed in the plurality of conductive layers 102 and supports a posture of the contact portion 102a of the plurality of conductive layers 102.

Next, the memory cell MC of the present embodiment will be described.

Figure 4:
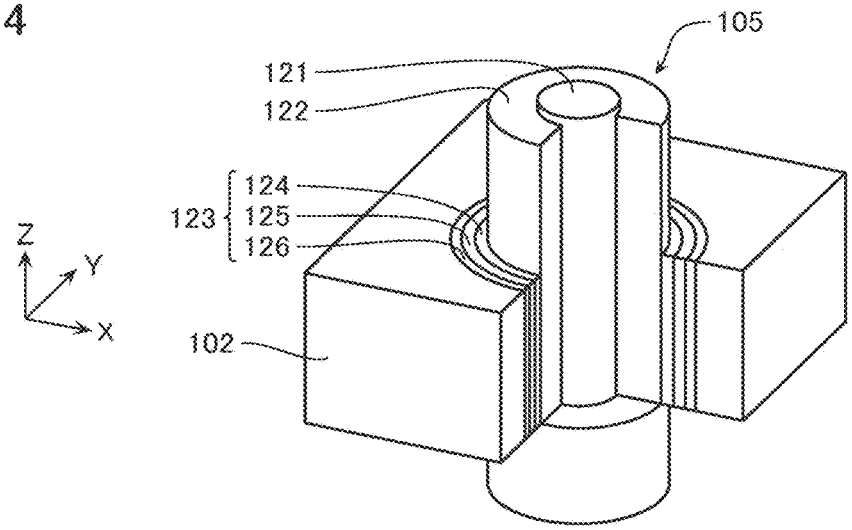
FIG. 4 is a perspective view showing a schematic structure of a memory cell in the nonvolatile semiconductor memory device according to the same embodiment.

FIG. 4 is a perspective view showing a schematic structure of the memory cell in the nonvolatile semiconductor memory device according to the present embodiment. Note that a similar structure to that of FIG. 4 may be adopted also for the source side select transistor STS and the drain side select transistor STD.

The memory cell MC of the present embodiment is configured by a so-called MONOS (Metal-Oxide-Nitride-Oxide-Silicon) type transistor. In other words, the memory cell MC is formed at an intersection of the conductive layer 102 and the memory columnar body 105. The memory columnar body 105 includes: a core insulating layer 121; and a semiconductor layer 122 that covers a side surface of the core insulating layer 121. Moreover, the memory cell array 1 includes a multi-film layer 123 disposed between the semiconductor layer 122 and the conductive layer 102. The multi-film layer 123 includes the following, deposited from the semiconductor layer 122 to the conductive layer 102, namely: a tunnel insulating layer 124 (first insulating layer); a charge accumulation layer 125; and a block insulating layer 126 (second insulating layer). Note that in the case of the present embodiment, configurations from the core insulating layer 121 to the block insulating layer 126 are included in the memory columnar body 105.

The core insulating layer 121 is formed from the likes of silicon oxide ($SiO_2$), for example. The semiconductor layer 122 is formed from the likes of polysilicon (Poly-Si), for example, and functions as a channel of the memory cell MC, the source side select transistor STS, and the drain side select transistor STD. The tunnel insulating layer 124 is formed from the likes of silicon oxide ($SiO_2$), for example. The charge accumulation layer 125 is formed having as its main component an insulator capable of charge accumulation, of the likes of silicon nitride ($Si_3N_4$), for example. The block insulating layer 126 is formed from the likes of silicon oxide ($SiO_2$), for example. Note that the memory cell MC may include a block high-permittivity layer and a barrier layer between the block insulating layer 126 and the conductive layer 102. The block high-permittivity layer is formed from a metal oxide such as aluminum oxide ($Al_2O_3$) or hafnium oxide ($HfO_x$), for example. The barrier layer is formed from a metal nitride such as titanium nitride (TiN), tungsten nitride (WN), and tantalum nitride (TaN), for example. Moreover, although the charge accumulation layer 125 having as its main component silicon nitride ($Si_3N_4$) will be described below, it should be noted that the embodiments below may be similarly applied also to a charge accumulation layer whose main component is another material.

In data write or data erase to the memory cell MC of the above-described structure, a high electric field is applied to the tunnel insulating layer 124 between the semiconductor layer 122 and the charge accumulation layer 125, whereby electrons or holes are injected into the charge accumulation layer 125. As a result, a charge amount in the charge accumulation layer 125 changes, whereby a threshold voltage of the memory cell MC shifts. Moreover, in the memory cell MC, different threshold voltages are allocated with values (in the case of 4 values/cell, '11', '01', '10', and '100'), whereby data is stored.

Miniaturization and stacking are effective for increasing capacity of the nonvolatile semiconductor memory device, but to achieve that, it is desirable to improve efficiency and lower an operation voltage of data write and date erase. To achieve that, the following are required of the charge accumulation layer 125, namely: (1) improvement of trapping capacity of electrons and holes; (2) improvement of holding capacity of electrons and holes; and (3) film thinning of physical film thickness. As previously mentioned, the charge accumulation layer 125 is formed from silicon nitride ($Si_3N_4$), for example. However, in the case of simply employing only silicon nitride ($Si_3N_4$), charge accumulation capacity lowers along with film thinning, hence it is difficult to make the physical film thickness 5 nm or less. Moreover, this is an obstructive factor of miniaturization and film thinning of a MONOS type transistor.

Lowering of charge accumulation capacity accompanying film thinning of the charge accumulation layer 125 is due to many of quasiparticles injected via the tunnel insulating layer 124 ending up passing through the charge accumulation layer 125 to escape to the block insulating layer 126. Therefore, in order to improve charge accumulation performance of the charge accumulation layer 125, it is desirable to efficiently scatter and efficiently accumulate the injected quasiparticles. However, in a defect where quasiparticles are efficiently accumulated, electron scattering cross-sectional area is small, whereas in a defect where quasiparticles are efficiently scattered, electron accumulation capacity is low, whereby these defects have conflicting characteristics.

Accordingly, the present embodiment is configured to have the defect performing an accumulation function of electrons which are the quasiparticles of the charge accumulation layer 125 and the defect performing a scattering function of electrons of the charge accumulation layer 125, isolated.

Figure 5:
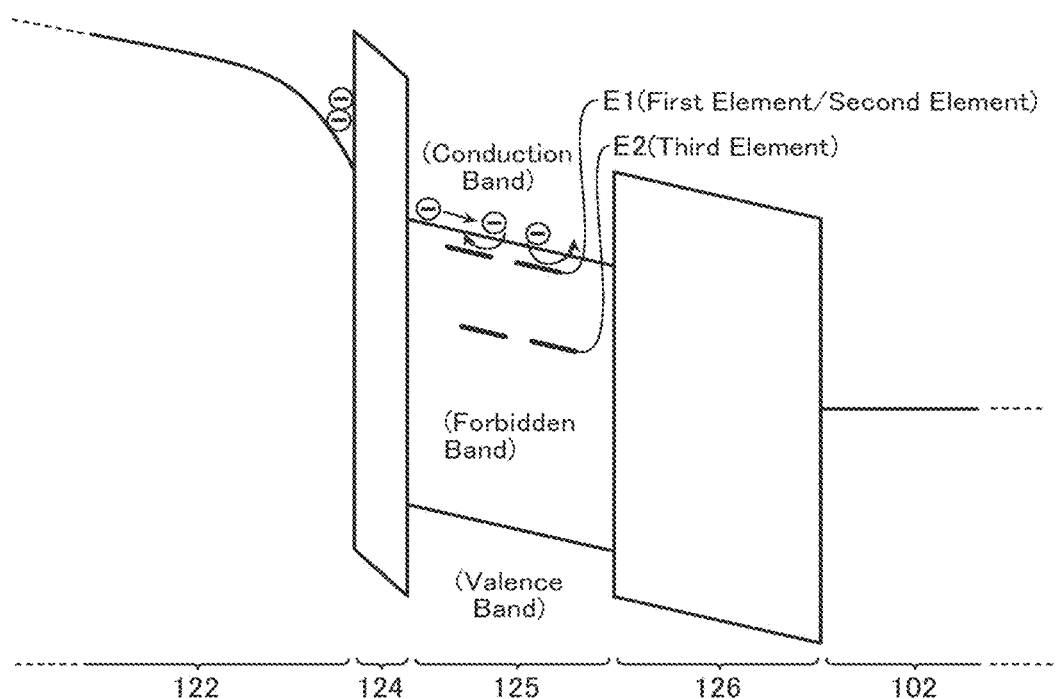
FIG. 5 is a view explaining an operation principle of the memory cell in the nonvolatile semiconductor memory device according to the same embodiment.

FIG. 5 is a view explaining an operation principle of the memory cell in the nonvolatile semiconductor memory device according to the present embodiment. This view shows energy bands of the memory cell MC.

In the case of the memory cell MC of the present embodiment, the charge accumulation layer 125 has the following added thereto, namely: a first element or a second element, the first element being different from the main component of the charge accumulation layer 125, and the second element being different from the first element; and a third element. The first element is an element giving rise to a first site that performs an electron scattering function. This first site scatters electrons by resonance elastic scattering, and has an energy level E1 close to a conduction band, of a forbidden band of silicon nitride ($Si_3N_4$). The third element is an element giving rise to a second site that performs an electron trapping function. This second site is a site causing inelastic scattering, and has a comparatively deep energy level E2 of the forbidden band of silicon nitride ($Si_3N_4$). In the present embodiment, injected electrons to the charge accumulation layer 125 are scattered by the first site having the comparatively shallow energy level E1 to lengthen a movement distance of electrons in the charge accumulation layer 125, and these undergo inelastic scattering by the second site having the comparatively deep energy level E2 to improve charge accumulation capacity.

Next, the element (impurity) added to the charge accumulation layer 125 will be described.

An impurity of the charge accumulation layer 125 approximates to a shape of V(r) satisfying $\lim_{r \to \infty} r^2 V(r) = 0$ and $\lim_{r \to 0} r^2 V(r) = 0$ with central symmetry around a potential on a charged quasiparticle formed in the charge accumulation layer 125. However, r is a scalar value expressing a movement diameter from an impurity center. Assuming an effective mass of the quasiparticle to be μ, energy to be E, and angular momentum with respect to the impurity center to be l, and assuming a wave function in a movement diameter direction having the wave function of the charged quasiparticle partially wave expanded to be $R_1(r)$, then $\chi_1(r) = rR_1(r)$ satisfies a Schroedinger equation.

$$\frac{d^2}{dr^2}\chi_1(r) + \left[k^2 - U(r) - \frac{l(l+1)}{r^2}\right]\chi_1(r) = 0 \quad \text{[Mathematical Expression 1]}$$

$$\therefore U(r) = \frac{2\mu V(r)}{\hbar^2}, \quad k = \sqrt{\frac{2\mu E}{\hbar^2}}$$

A partial wave scattering cross section $\sigma_1(E)$ obtained by solving mathematical expression 1 is given by the following expression.

$$\sigma_l(E) = \frac{4\pi(2l+1)}{k^2} \frac{\left(\frac{\Gamma_l}{2}\right)^2}{(E-E_R)^2 + \left(\frac{\Gamma_l}{2}\right)^2} \quad \text{[Mathematical Expression 2]}$$

However, $E_R$ is energy corresponding to $k_R$ satisfying $\delta_1(k_R) = \pi/2$ with respect to sin $\delta_1(k) = -k\int_0^\infty U(r)j_1(kr)\chi_1(kr)r^2 dr$, that is, the following expression.

$$E_R = \frac{\hbar^2}{2m}k_R^2 \quad \text{[Mathematical Expression 3]}$$

Note that $j_1(\chi)$ is a spherical Bessel function of the first kind. Moreover, $\Gamma_1$ is an amount given by $\Gamma_1/2 = (d\delta_1/dE)_{E=ER}$. From mathematical expression 2, the partial wave scattering cross section $\sigma_1$ gives a peak maximum value $\pi(2l+1)/k_R^2$ when energy E of the quasiparticle has a value close to $E_R$, and a half-value width of this peak maximum value is $\Gamma_1$.

Energy depth of an added element (first element) causing resonance elastic scattering or a resonance elastic scattering site are measurable by a photoluminescence method, an electroluminescence method, a spectrum ellipsometry method, an electron spin resonance method, a charge pumping method, and so on. Provided the energy depth from the conduction band is not more than 0.4 eV, electrons primarily undergo elastic scattering, hence a distinction can be made from an inelastic scattering impurity or inelastic scattering site where the energy depth from the conduction band is 0.6 eV or more.

When, for example, hafnium (Hf) is added as an impurity in the charge accumulation layer 125, an impurity potential V(r) occurs in the $Si_3N_4$. In the case of electrons that have passed through the tunnel insulating layer 124 and have a kinetic energy of E=0.4 eV, then, for example, resonance energy as a quasiparticle will be $E_R$=0.4 eV and resonance energy width will be about 0.5 eV. Electrons injected from the tunnel insulating layer 124 form a resonance state of an average of about $10^{-15}$ s, for example, around hafnium (Hf), hence a time that electrons injected from the tunnel insulating layer 124 are staying in the charge accumulation layer 125 until they penetrate the block insulating layer 126 will extend on average by as much as approximately five times. By thus adding hafnium (Hf) of a kind causing resonance elastic scattering in the charge accumulation layer 125, a probability of, for example, injected electrons reaching an inelastic resonance site in the charge accumulation layer 125 increases by, for example, approximately five times, and an improvement in charge trapping capacity of the charge accumulation layer 125 is expected. Of such impurities of a kind causing resonance elastic scattering, one for which a shallow energy level is formed in the charge accumulation layer 125 is preferable, since it increases a resonance elastic scattering cross-sectional area and since a staying time of electrons in the charge accumulation layer 125 due to increased duration of the resonance state lengthens. Such an impurity (first element) includes the likes of zirconium (Zr), titanium (Ti), tantalum (Ta), niobium (Nb), vanadium (V), tungsten (W), molybdenum (Mo), chromium (Cr), rhenium (Re), manganese (Mn), carbon (C), scandium (Sc), aluminum (Al), and phosphorus (P), for example, besides hafnium (Hf). Hereafter, such resonance elastic scattering will sometimes also be called "first kind resonance elastic scattering".

Although even a single body of the above-described impurity causing first kind resonance elastic scattering has an effect of improving charge accumulation characteristics of the charge accumulation layer 125, adding also an impurity causing inelastic scattering (third element), in addition to the impurity causing first kind resonance elastic scattering, makes it possible to further improve charge accumulation characteristics. Such an impurity causing inelastic scattering preferably has an energy level located close to a mid gap of the charge accumulation layer 125, and includes the likes of ruthenium (Ru), nickel (Ni), rhodium (Rh), osmium (Os), iridium (Ir), platinum (Pt), palladium (Pa), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), yttrium (Y), germanium (Ge), tin (Sn), antimony (Sb), bismuth (Bi), sulfur (S), selenium (Se), tellurium (Te), zinc (Zn), magnesium (Mg), calcium (Ca), strontium (Sr), and barium (Ba), for example.

In the case of, for example, having two or more kinds of energy levels like the nitrogen defect site in the charge accumulation layer 125, electrons injected into the charge accumulation layer 125 in a start state lose energy by exciting electrons already trapped in the impurity or the defect site, and may be temporarily trapped in the impurity or the defect site. This state has a finite life, and by interaction of excited electrons and electrons injected from outside in a finish state, a state is achieved where some of the electrons lose energy to be completely trapped, and the others of the electrons gain energy to separate from the impurity site. In this case, an electron of 1.0 eV, for example, acting as a quasiparticle injected from the tunnel insulating layer 124 excites by 1.0 eV an electron already trapped in a lower energy level of the nitrogen defect site of the charge accumulation layer 125, thereby shifting it to a higher energy level, and at the same time, loses energy itself and becomes a second electron existing close to the nitrogen defect site of the charge accumulation layer 125; then, after, for example, $10^{-14}$ s, it is generated again by separating from the nitrogen defect site, and although a channel width of energy of an incident electron is extremely narrow, being about 0.01 eV, there is an effect that the electron can be kept for an extremely longtime in the charge accumulation layer 125. Such an impurity (second element) or defect site includes the likes of hydrogen (H), fluorine (F), chlorine (Cl), bromine (Br), and iodine (I), for example, in addition to the above-described nitrogen defect site. Hereafter, such resonance elastic scattering will sometimes also be called "second kind resonance elastic scattering".

Although even a single body of the above-described impurity or defect site causing second kind resonance elastic scattering has an effect of improving charge accumulation characteristics of the charge accumulation layer 125, adding also an impurity causing inelastic scattering (third element), in addition to the impurity causing second kind resonance elastic scattering (second element), similarly to in the case of adding the impurity causing first kind resonance elastic scattering (first element), makes it possible to further improve charge accumulation characteristics of the charge accumulation layer 125. Such a second element causing inelastic scattering preferably has an energy level located close to a mid gap of the charge accumulation layer 125.

Figure 6:
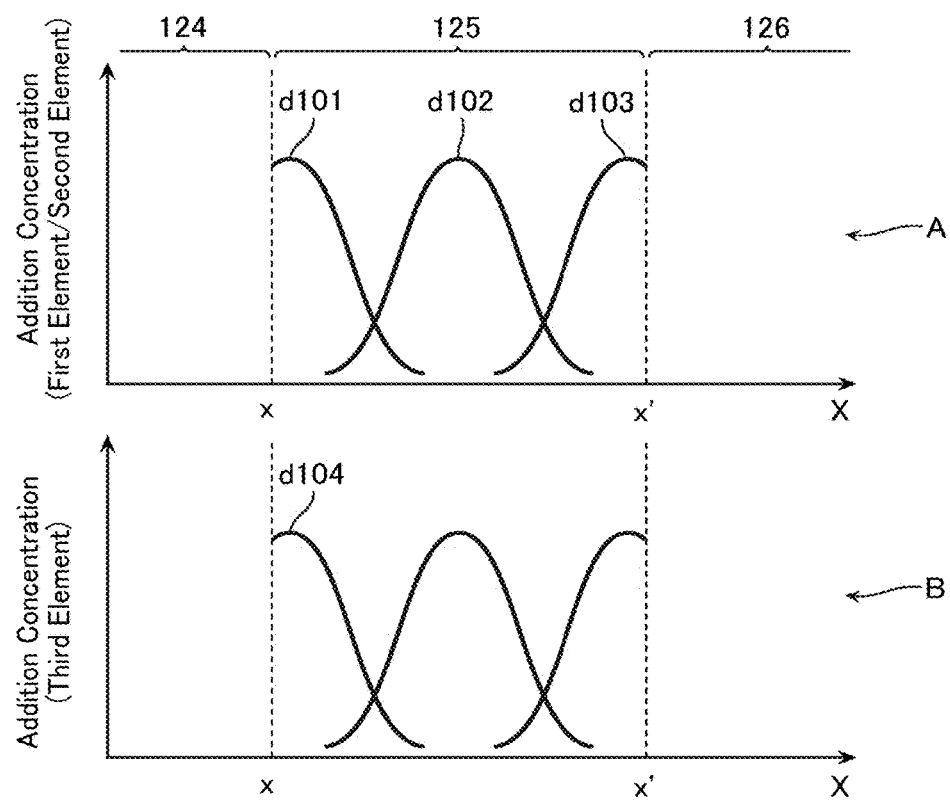
FIG. 6 is a view showing addition concentrations of elements to a charge accumulation layer of the memory cell in the nonvolatile semiconductor memory device according to the same embodiment.
Figure 7A:
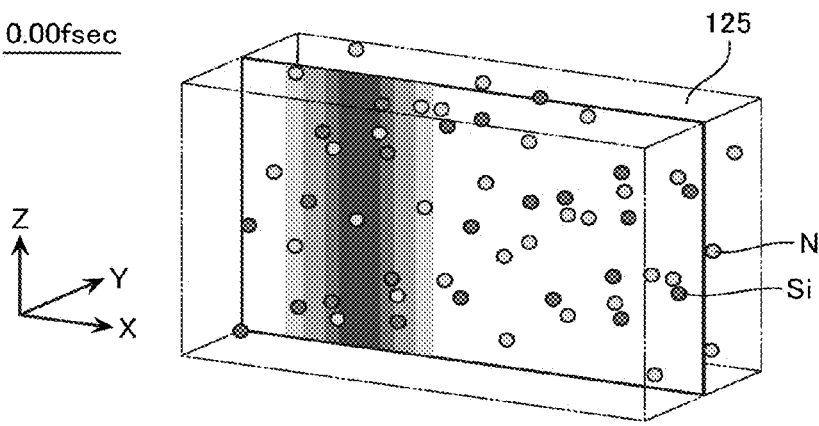
FIGS. 7A to 7H are views explaining a time dependency of injected electron concentration of the charge accumulation layer of the memory cell in the nonvolatile semiconductor memory device according to the same embodiment.
Figure 7B:
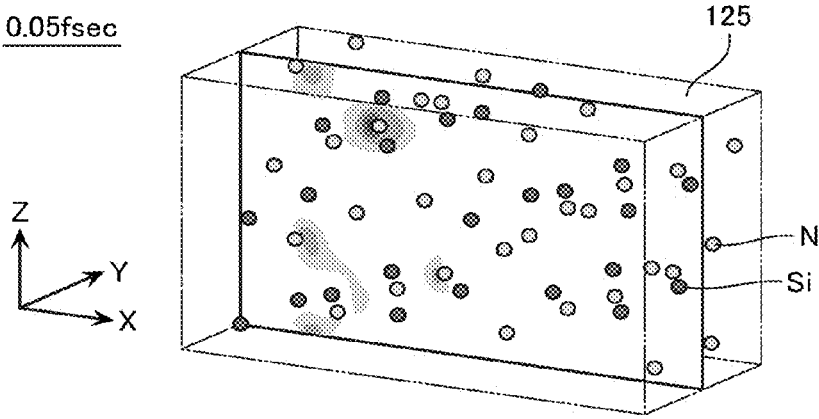
Figure 7C:
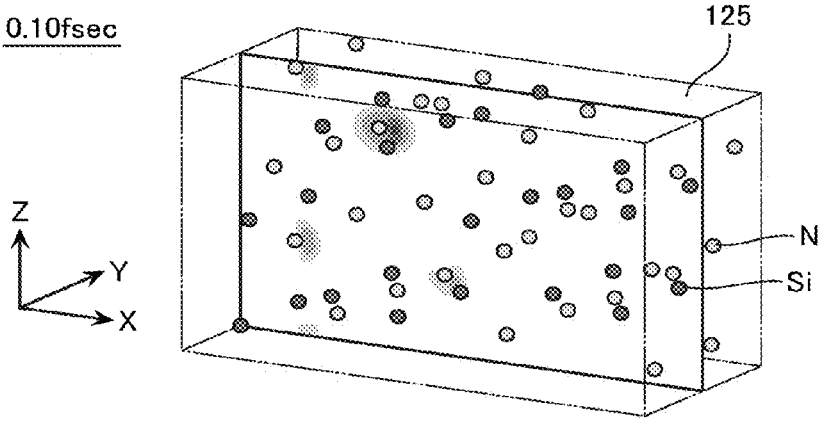
Figure 7D:
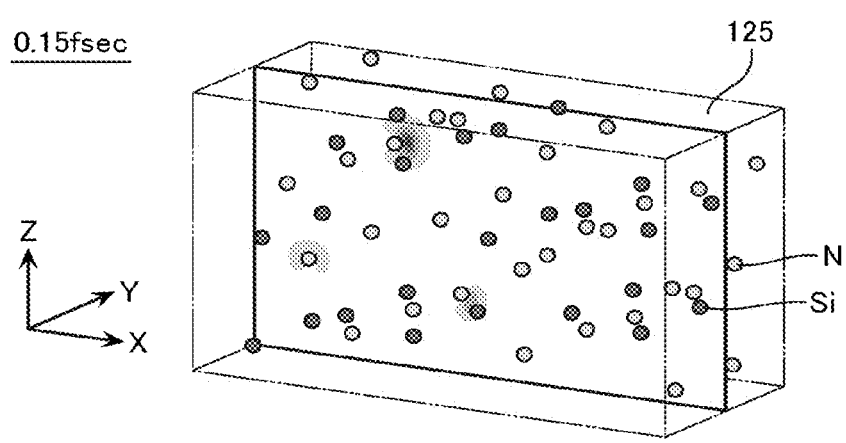
Figure 7E:
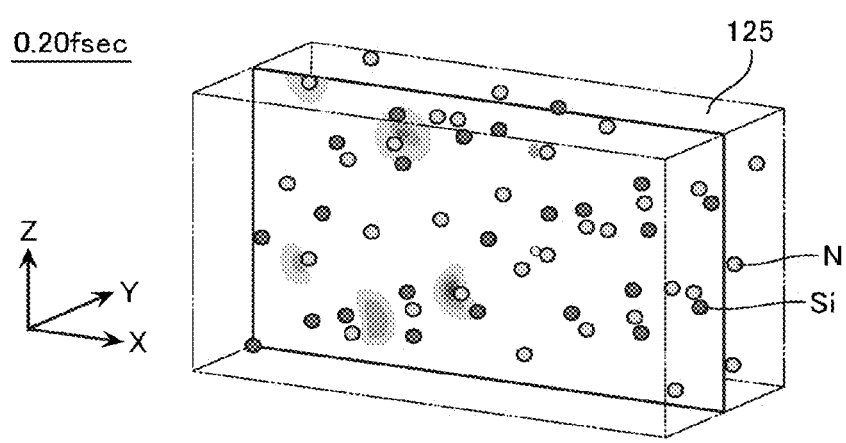
Figure 7F:
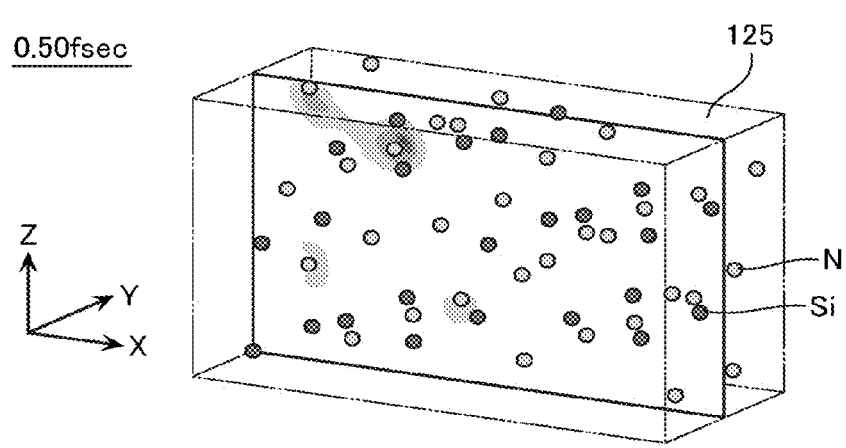
Figure 7G:
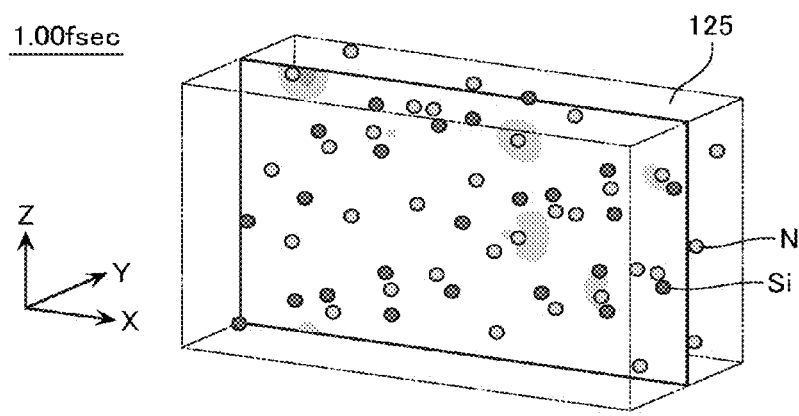
Figure 7H:
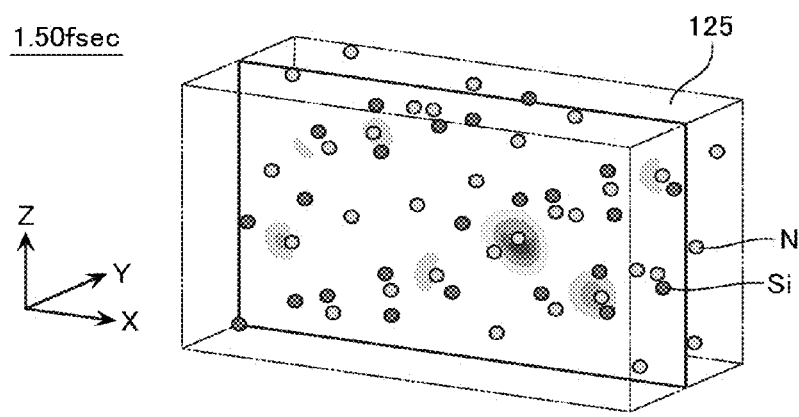

FIG. 6 is a view showing addition concentrations of elements to the charge accumulation layer of the memory cell in the nonvolatile semiconductor memory device according to the present embodiment. A in FIG. 6 shows a concentration of the first element and the second element; and B in FIG. 6 shows a concentration of the third element. The symbol x in FIG. 6 indicates a boundary of the tunnel insulating layer 124 and the charge accumulation layer 125; and the symbol x' in FIG. 6 indicates a boundary of the charge accumulation layer 125 and the block insulating layer 126.

When an addition concentration peak of the first element causing first kind resonance elastic scattering, an addition concentration peak of the second element causing second kind resonance elastic scattering, or a site of second kind resonance elastic scattering exists closely adjacent to an addition concentration peak of the third element causing inelastic scattering (for example, a combination of distributions d101 and d104 of FIG. 6), it becomes easy for a quasiparticle whose staying time to the elastic scattering site has extended by resonance elastic scattering to be guided to a closely adjacent inelastic scattering site, whereby charge accumulation performance of the charge accumulation layer 125 improves.

Moreover, when the addition concentration peak of the first element, the addition concentration peak of the second element, or the site of second kind resonance elastic scattering exists close to the tunnel insulating layer 124 (distribution d101 of FIG. 6), a quasiparticle that has tunneled from the tunnel insulating layer 124 undergoes elastic scattering, whereby an orbit of the quasiparticle changes from a film thickness direction. Therefore, a movement distance in the charge accumulation layer 125 lengthens, whereby the quasiparticle becomes easily trapped in the charge accumulation layer 125. As a result, charge accumulation performance of the charge accumulation layer 125 improves. In this case, even if the first element is segregated between the tunnel insulating layer 124 and the charge accumulation layer 125, charge accumulation performance of the memory cell MC improves similarly to as described above.

Moreover, when the addition concentration peak of the first element, the addition concentration peak of the second element, or the site of second kind resonance elastic scattering exists centrally in a film thickness direction of the charge accumulation layer 125 (distribution d102 of FIG. 6), it becomes easy for a quasiparticle whose staying time to the elastic scattering site has extended by resonance elastic scattering to be guided to a closely adjacent inelastic scattering site, whereby charge accumulation performance of the charge accumulation layer 125 improves. In addition, a quasiparticle that has tunneled from the tunnel insulating layer 124 undergoes elastic scattering, whereby an orbit of the quasiparticle changes from a film thickness direction. Therefore, a movement distance in the charge accumulation layer 125 lengthens, whereby the quasiparticle becomes easily trapped in the charge accumulation layer 125. As a result, charge accumulation performance of the charge accumulation layer 125 improves.

Moreover, when the addition concentration peak of the first element, the addition concentration peak of the second element, or the site of second kind resonance elastic scattering exists close to the block insulating layer 126 (distribution d103 of FIG. 6), quasiparticles backscattered by resonance elastic scattering are increased, whereby charge accumulation performance of the charge accumulation layer 125 improves.

Figure 8:
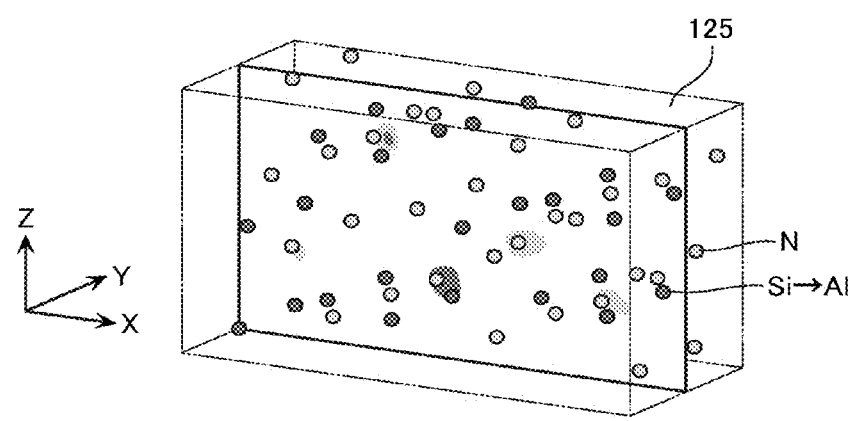
FIG. 8 is a view explaining a difference between a change of injected electron concentration of the charge accumulation layer and a change of injected electron concentration when a silicon atom is substituted by an aluminum atom of the charge accumulation layer, of the memory cell in the nonvolatile semiconductor memory device according to the same embodiment.

FIGS. 7A to 7H are views explaining a time dependency of injected electron concentration of the charge accumulation layer of the memory cell in the nonvolatile semiconductor memory device according to the present embodiment. In FIGS. 7A to 7H, a dark-colored sphere indicates a silicon atom, and a light-colored sphere indicates a nitrogen atom. Moreover, in FIGS. 7A to 7H, a dark-colored portion indicates a portion where electron concentration is high, and a light-colored portion indicates a portion where electron concentration is low. In addition, FIG. 8 is a view explaining a difference between a change of injected electron concentration of the charge accumulation layer and a change of injected electron concentration when a silicon atom is substituted by an aluminum atom of the charge accumulation layer, of the memory cell in the nonvolatile semiconductor memory device according to the present embodiment. In FIG. 8, a dark-colored sphere indicates an aluminum atom, and a light-colored sphere indicates a nitrogen atom. Moreover, in FIG. 8, a dark-colored portion indicates a portion where electron concentration is higher compared to in silicon nitride ($Si_3N_4$), and a light-colored portion indicates a portion where electron concentration is lower compared to in silicon nitride ($Si_3N_4$). These drawings are based on first principle calculation.

As may be understood from FIGS. 7A to 7H, portions of high electron concentration clearly spread more focusing on the nitrogen atom sites, compared to in the charge accumulation layer 125 prior to electron injection. Moreover, it is clear from FIG. 8 that electron concentration on a tunnel insulating layer 124 side of the aluminum atom site is high, and electron concentration on a block insulating layer 126 side of the aluminum atom site is low. This is conceivably reflecting that injected electrons have been backscattered by the added aluminum atoms. As a result, penetration of charge of the charge accumulation layer 125 can be suppressed, and an improvement in charge accumulation performance of the charge accumulation layer 125 can be achieved.

In the case of similarly adding a fourth element such as gives rise to an energy level up to 0.7 eV with respect to an upper end of the valence band of the charge accumulation layer 125, an improvement in erase performance of accumulated charge by holes can be achieved.

Next, a method of manufacturing the memory cell array 1 of the present embodiment will be described.

Figure 10:
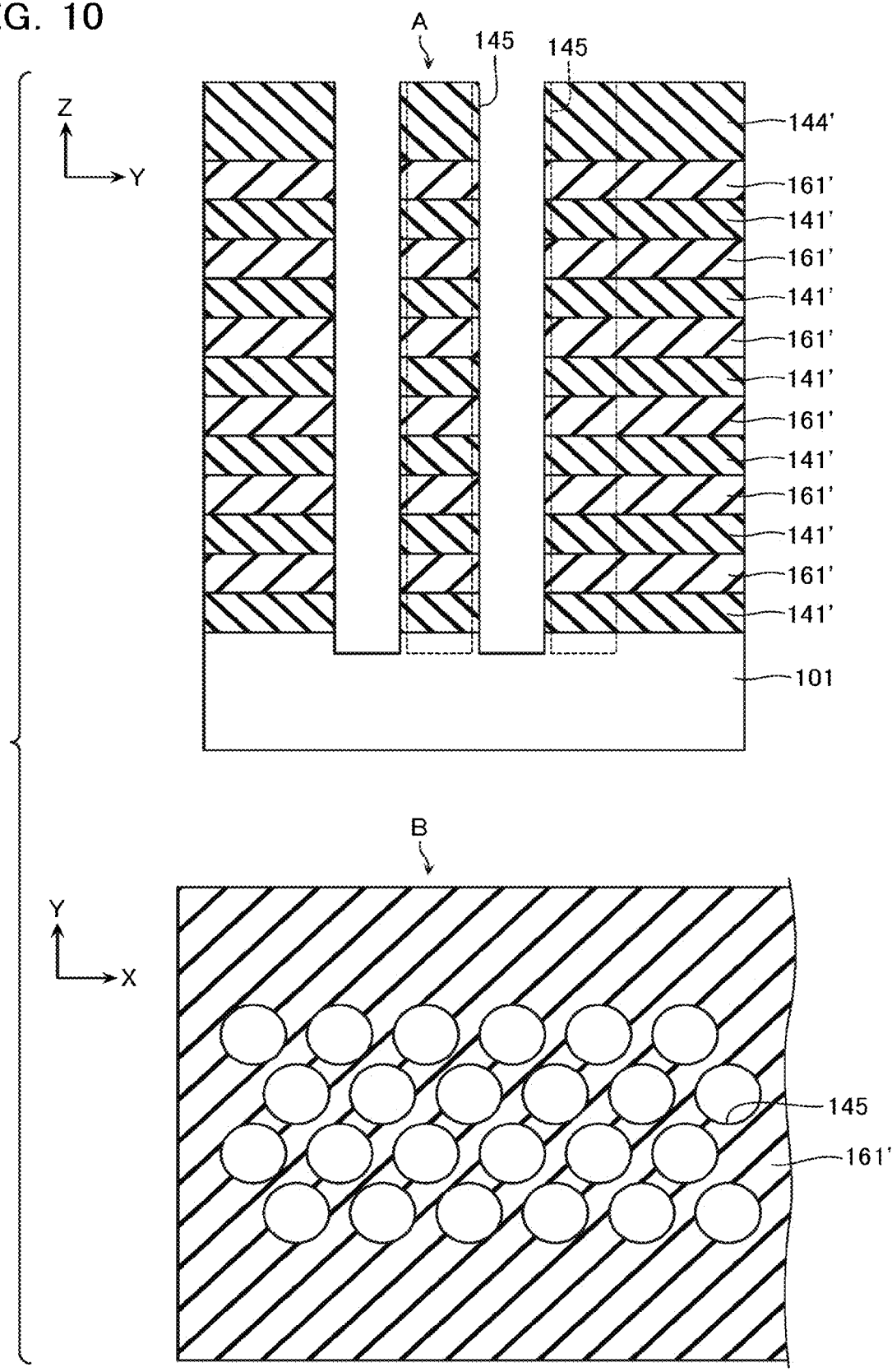
Figure 11:
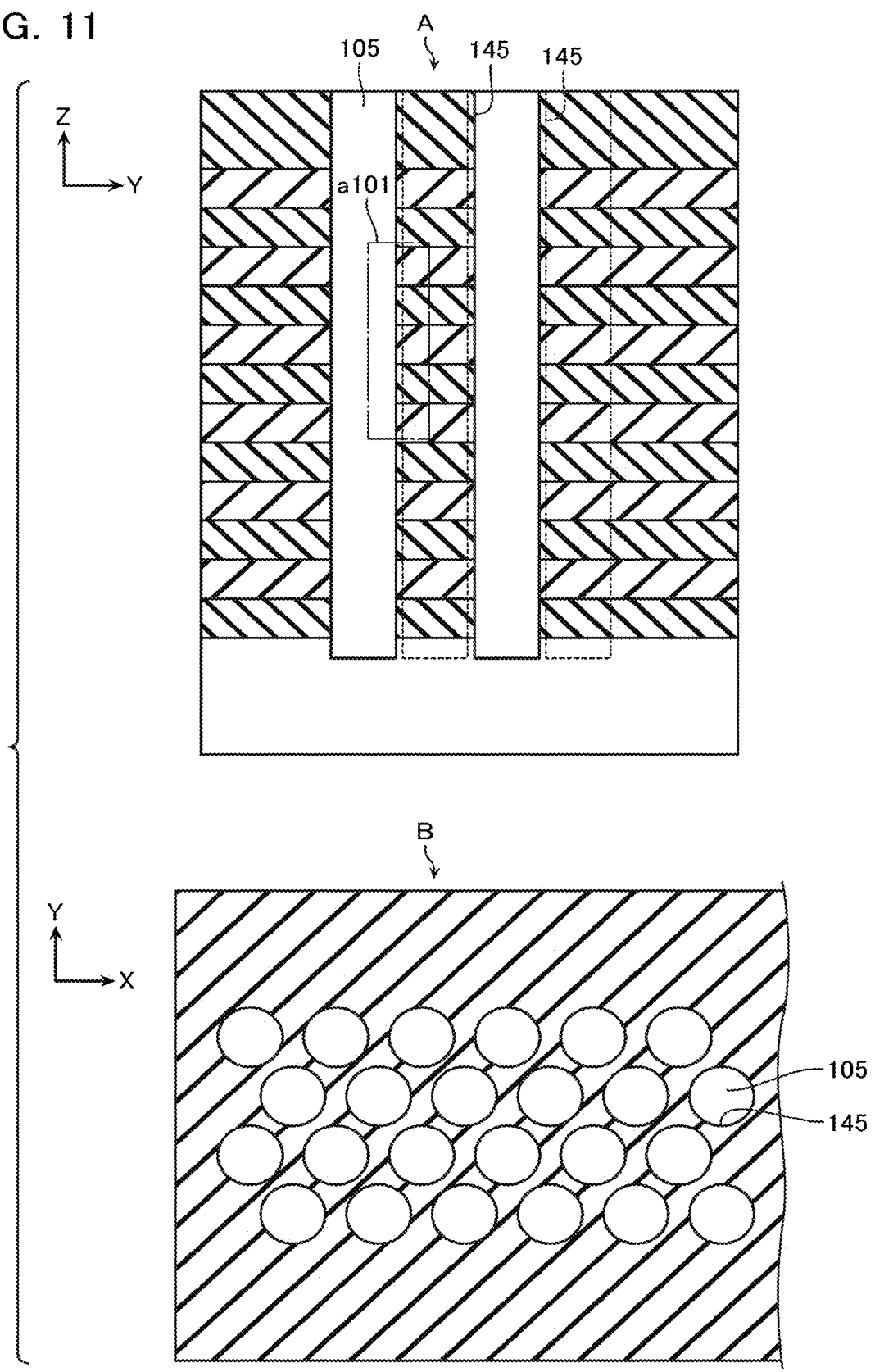
Figure 12:
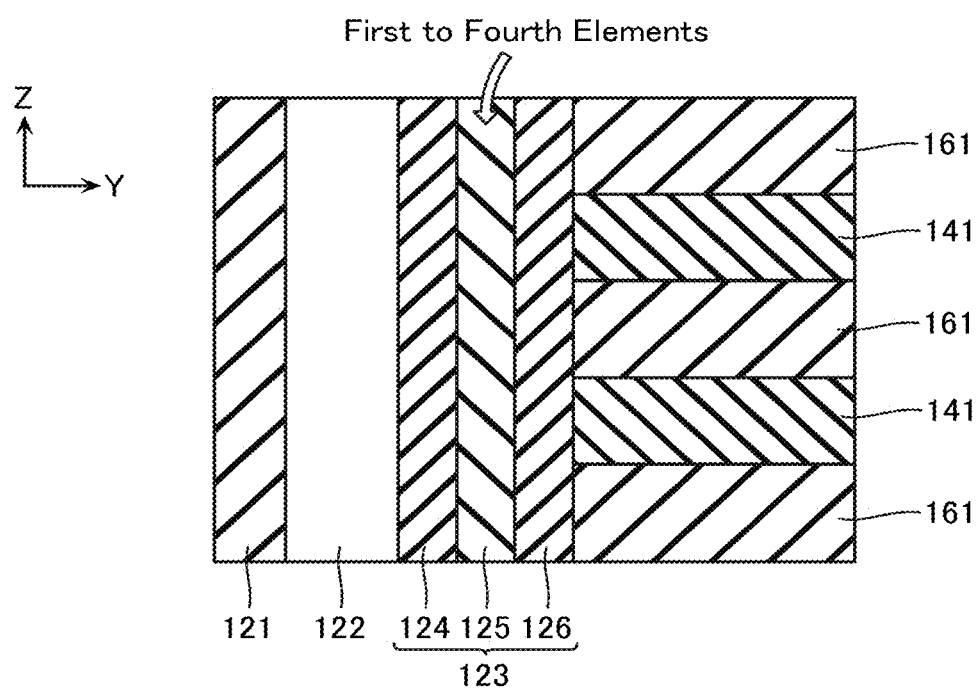

FIGS. 9 to 16 are views explaining manufacturing steps of the memory cell array in the nonvolatile semiconductor memory device according to the present embodiment. A in each of the drawings indicates a Y-Z cross-sectional view, and B in each of the drawings indicates an X-Y cross-sectional view. Moreover, FIG. 12 is a cross-sectional view enlarging the region a101 surrounded by a dot-chain line of FIG. 11.

Figure 9:
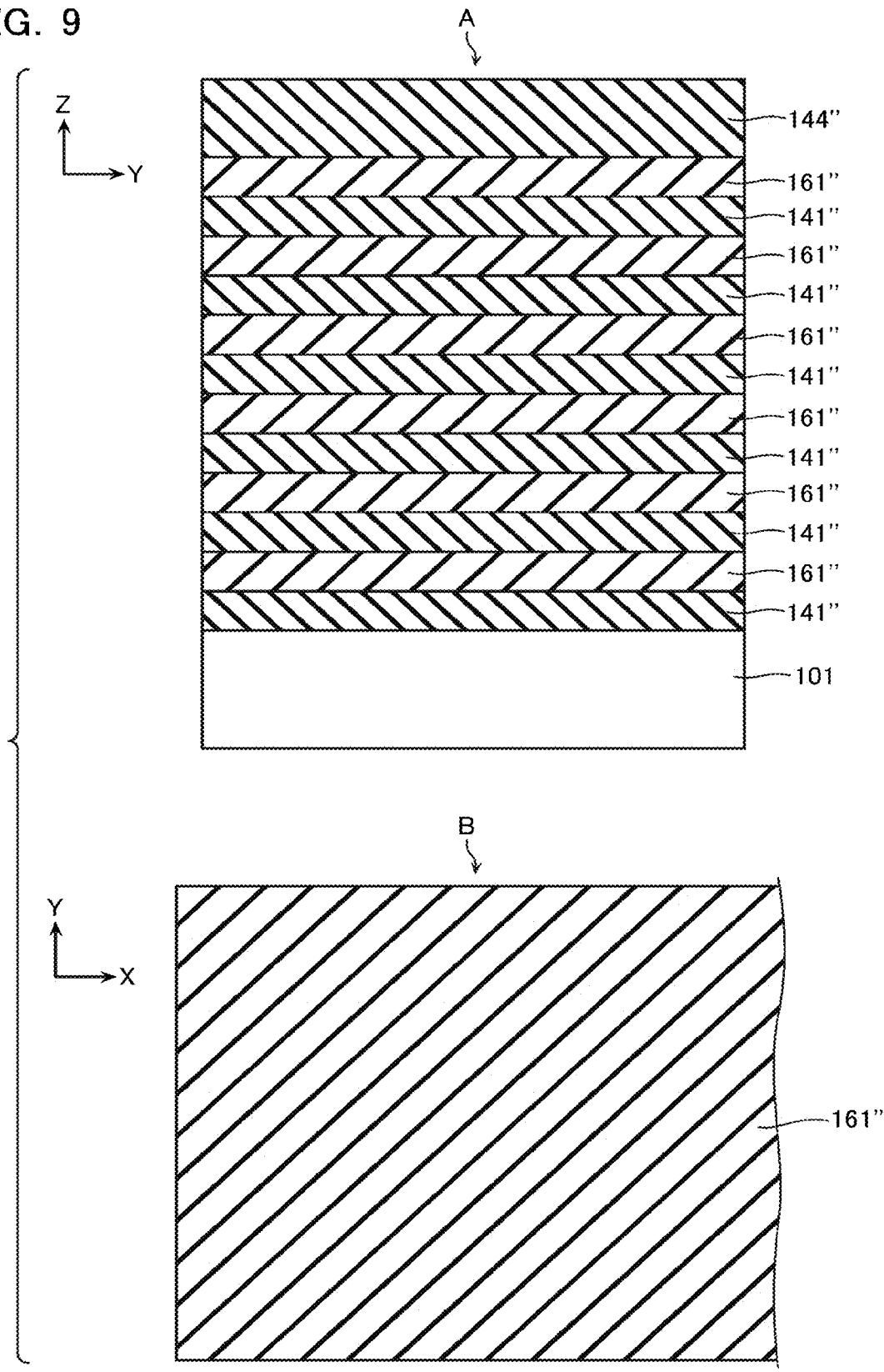
FIGS. 9 to 16 are views explaining manufacturing steps of the memory cell array in the nonvolatile semiconductor memory device according to the same embodiment.

First, as shown in FIG. 9, a plurality of inter-layer insulating layers 141" and sacrifice layers 161" are stacked alternately on the semiconductor substrate 101, and an inter-layer insulating layer 144" is stacked on the uppermost layer sacrifice layer 161". Now, the inter-layer insulating layers 141" and 144" are formed by the likes of silicon oxide ($SiO_2$), for example. Moreover, the sacrifice layer 161" is formed by the likes of silicon nitride ($Si_3N_4$), for example.

Then, as shown in FIG. 10, a plurality of through holes 145 extending in the Z direction are formed in the inter-layer insulating layers 141" and 144" and the sacrifice layers 161". Now, lithography and dry etching, for example, are employed in formation of the through hole 145. As a result, the inter-layer insulating layers 141" and 144" and the sacrifice layers 161" become inter-layer insulating layers 141' and 144' and sacrifice layers 161'. The through hole 145 becomes a memory hole 145.

Then, as shown in FIG. 11, a material of the memory columnar body 105 is implanted in the through hole 145.

As shown in FIG. 12, the material of the memory columnar body 105 is implanted, from a side surface of the through hole 145 to the center, in order of the block insulating layer 126, the charge accumulation layer 125, the tunnel insulating layer 124, the semiconductor layer 122, and the core insulating layer 121. Now, the block insulating layer 126 is formed by the likes of silicon oxide ($SiO_2$), for example. The charge accumulation layer 125 is formed by a material capable of charge accumulation, of the likes of silicon nitride ($Si_3N_4$), for example. The tunnel insulating layer 124 is formed by the likes of silicon oxide ($SiO_2$), for example. The semiconductor layer 122 is formed by the likes of polysilicon (Poly-Si), for example. The core insulating layer 121 is formed by the likes of silicon oxide ($SiO_2$), for example. Note that a block high-permittivity layer and a barrier layer may be included between the block insulating layer 126 and a sacrifice layer 161, as required. The block high-permittivity layer is formed by a metal oxide such as aluminum oxide ($Al_2O_3$) or hafnium oxide ($HfO_x$), for example. The barrier layer is formed by a metal nitride such as titanium nitride (TiN), tungsten nitride (WN), and tantalum nitride (TaN), for example.

Moreover, in the case of the present embodiment, when the charge accumulation layer 125 is deposited, the likes of hafnium (Hf) and zirconium (Zr) which will be the first element and the likes of ruthenium (Ru) and nickel (Ni) which will be the second element, are added at desired positions of the charge accumulation layer 125. In addition, the likes of fluorine (F) and chlorine (Cl) which will be the third element may be added and the fourth element may be added at desired positions of the charge accumulation layer 125, as required (outline arrow of FIG. 12).

Figure 13:
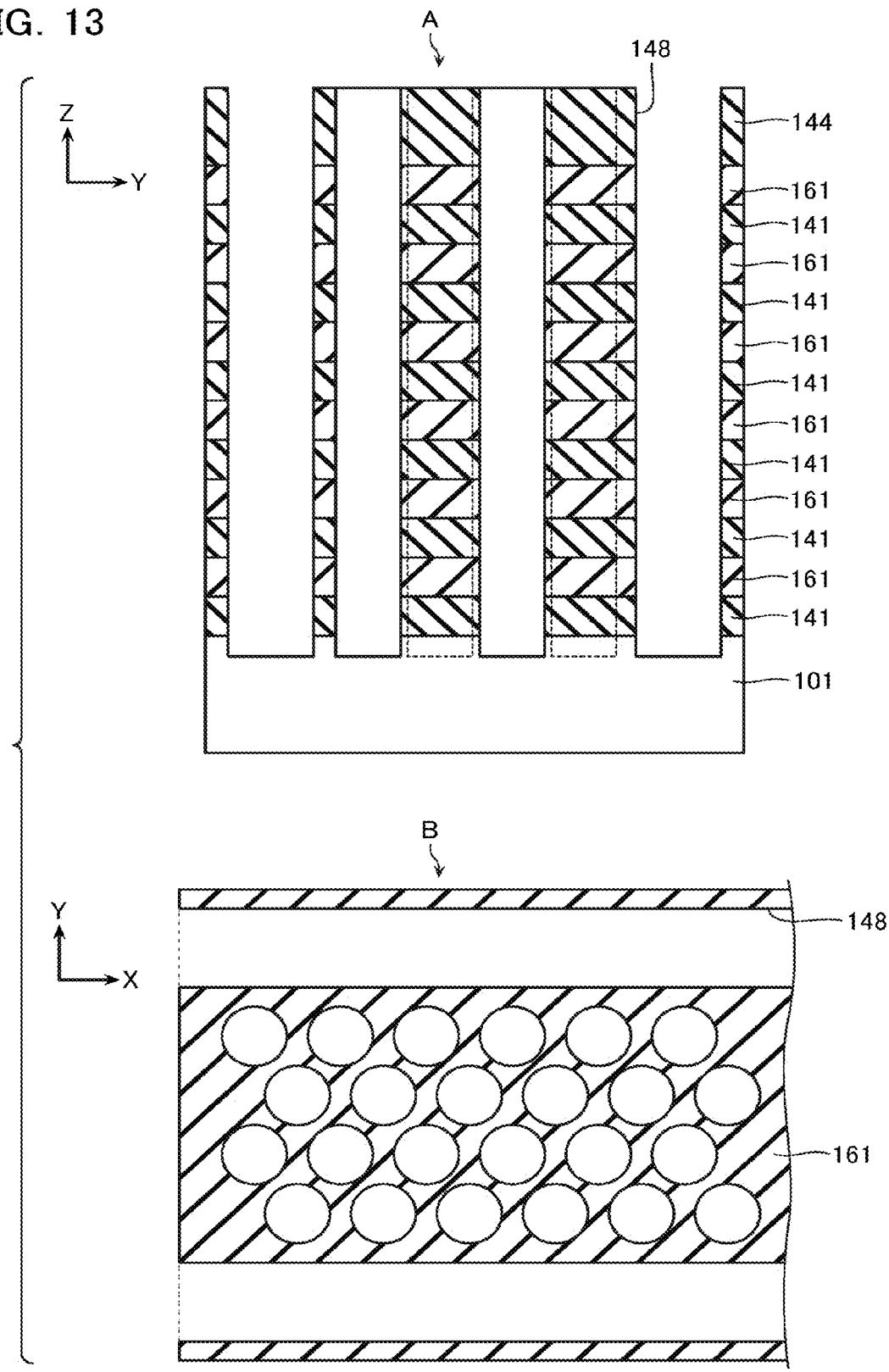

Then, as shown in FIG. 13, a plurality of trenches 148 having the Z direction as their depth direction and having the X direction as their extension direction are formed in the inter-layer insulating layers 141' and 144' and the sacrifice layers 161'. As a result, the inter-layer insulating layers 141' and 144' and the sacrifice layers 161' become inter-layer insulating layers 141 and 144 and sacrifice layers 161.

Figure 14:
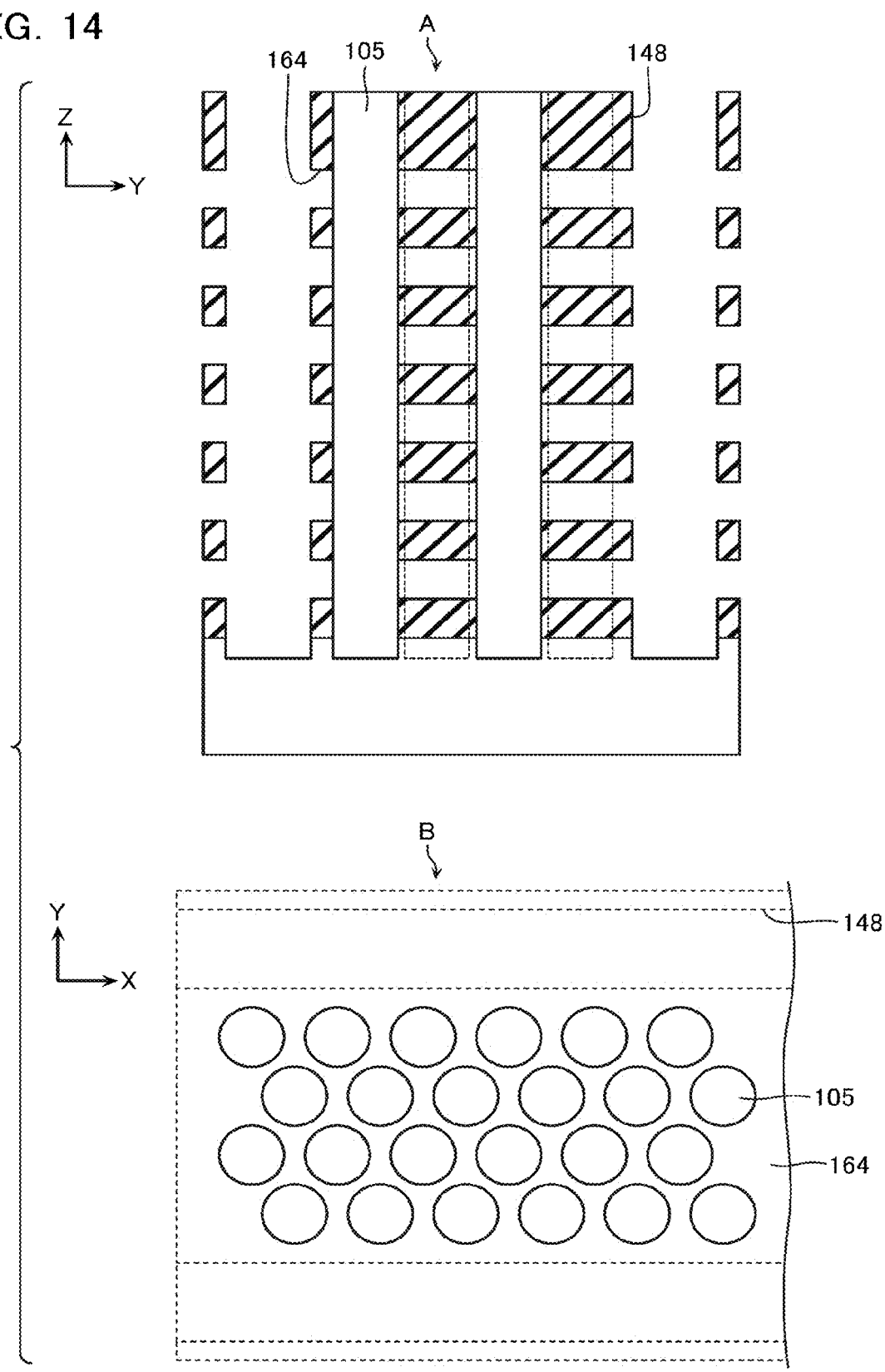

Then, as shown in FIG. 14, the sacrifice layer 161 is detached via the trench 148. As a result, a gap 164 is formed between adjacent inter-layer insulating layers 141 and between the inter-layer insulating layers 141 and 144. The memory columnar body 105 is exposed in the gap 164.

Figure 15:
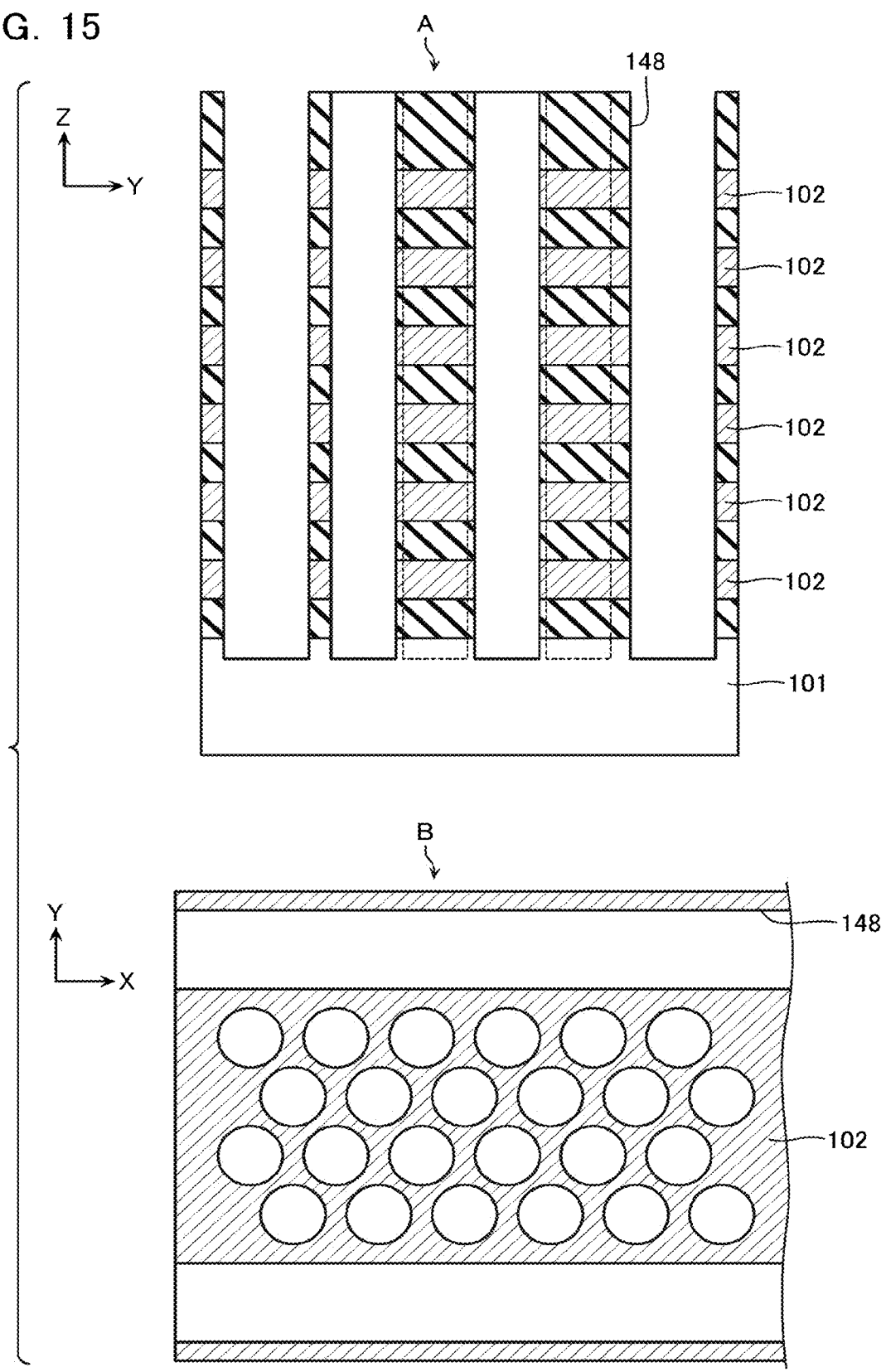

Then, as shown in FIG. 15, the conductive layer 102 is implanted in the gap 164 via the trench 148. Now, the conductive layer 102 is formed by the likes of tungsten (W), for example.

Figure 16:
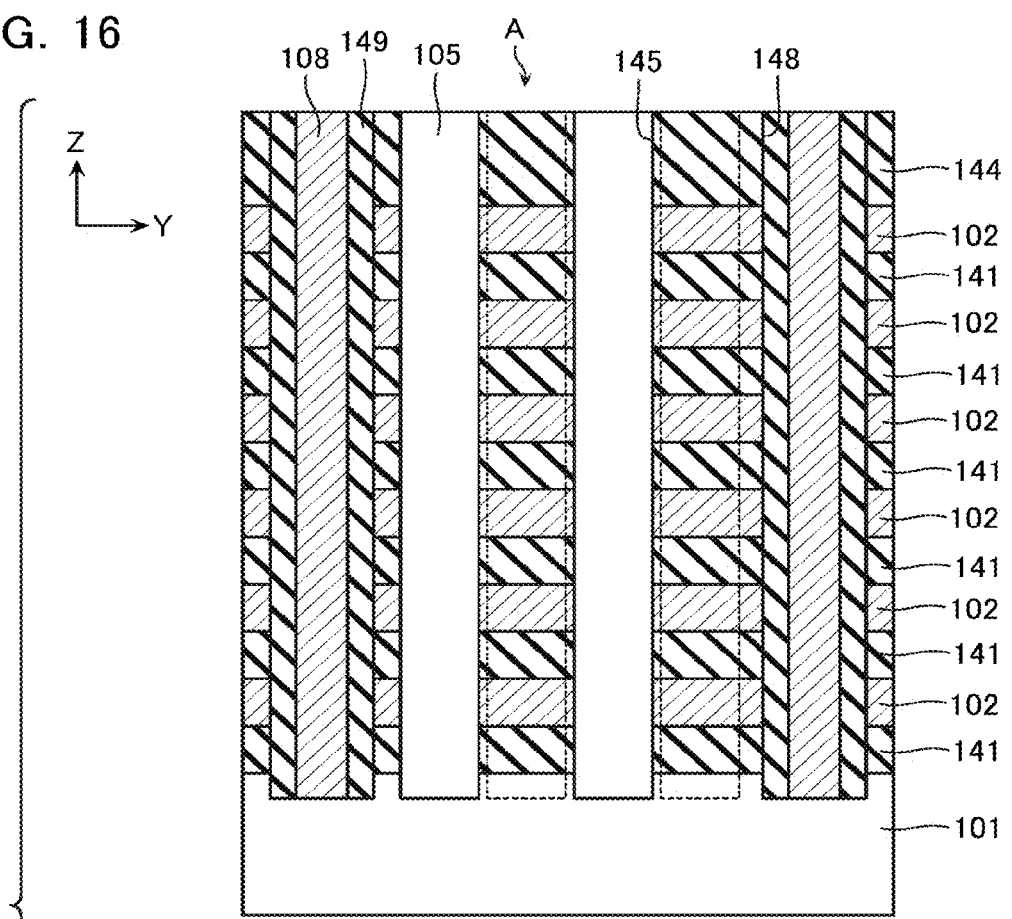
Figure 16:
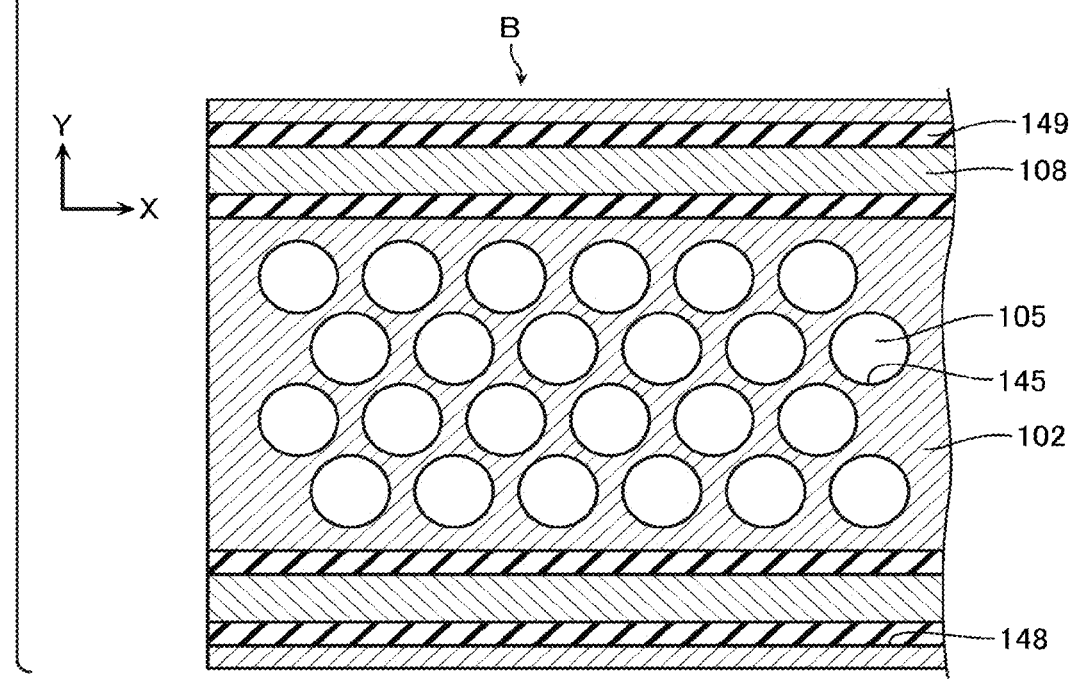

Finally, as shown in FIG. 16, an insulating layer 149 is deposited on a side surface of the trench 148, and then the conductive layer 108 is deposited.

The above are some of the manufacturing steps of the memory cell array 1 of the present embodiment.

The present embodiment makes it possible to provide a nonvolatile semiconductor memory device that by improving electron scattering capacity by a first element or a second element and improving electron accumulation capacity by a third element different from the first element or second element, achieves increased film thinning and increased efficiency of charge trapping of a charge accumulation layer.

Second Embodiment

In the first embodiment, a nonvolatile semiconductor memory device utilizing resonance elastic scattering to improve charge trapping efficiency, was described. In contrast, in the present embodiment, a nonvolatile semiconductor memory device utilizing inelastic scattering to improve charge trapping efficiency, will be described. Mainly, points of difference from the first embodiment will be described herein.

First, a structure of a memory cell MC of the present embodiment will be described.

Figure 17:
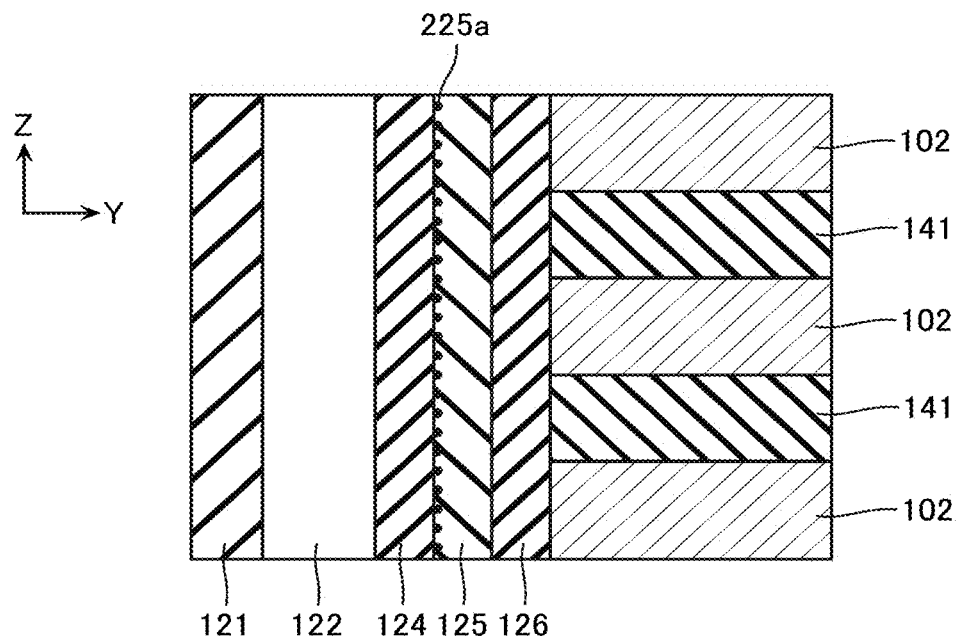
FIG. 17 is a cross-sectional view showing a schematic structure of a memory cell in a nonvolatile semiconductor memory device according to a second embodiment.
Figure 18:
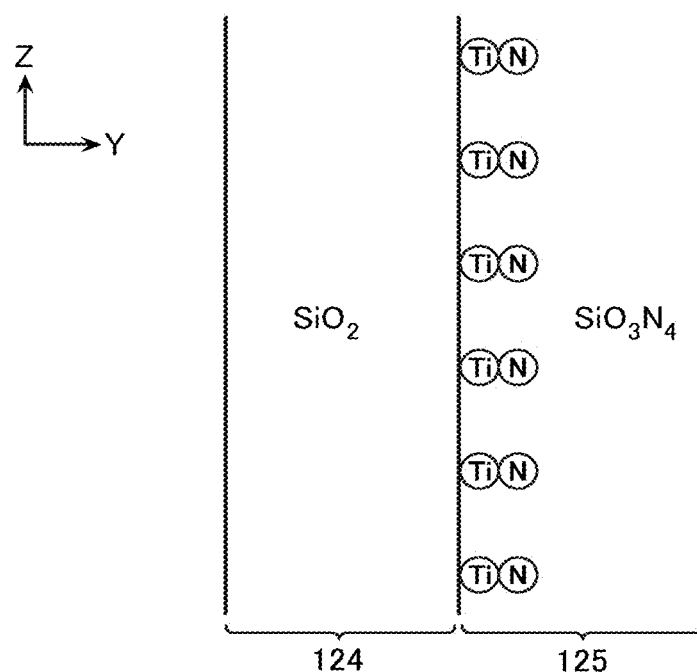
FIG. 18 is a cross-sectional view showing a schematic structure of the memory cell in the nonvolatile semiconductor memory device according to the same embodiment.

FIGS. 17 and 18 are cross-sectional views showing a schematic structure of the memory cell in the nonvolatile semiconductor memory device according to the second embodiment. FIG. 18 is a view enlarging a boundary of the tunnel insulating layer 124 and a charge accumulation layer 225 of FIG. 17.

In the case of the memory cell MC of the present embodiment, an element (fifth element) having a high scattering power of inelastic scattering with respect to the charge accumulation layer 225, specifically a metal whose atomic number is larger than that of silicon (Si), is added. In the case of FIG. 17, titanium (Ti) 225a is added to close to the tunnel insulating layer 124 of the charge accumulation layer 225. Now, employable as the metal configuring the fifth element, besides titanium (Ti) are, for example, calcium (Ca), strontium (Sr), barium (Ba), yttrium (Y), and a lanthanoid. Moreover, a plurality of these metals may be employed in combination. Although the case of employing titanium (Ti) as the metal (fifth element) will be described below as an example, it should be noted that the present embodiment may be applied also in the case of employing the likes of the above-listed metals.

Note that if too much of the metal is added to the charge accumulation layer 225, conductivity of the charge accumulation layer 225 becomes too high. Particularly, in the case of a memory cell array of three-dimensional structure as in the present embodiment, the charge accumulation layers 225 of a plurality of series-connected memory cells MC are formed continuously, hence so-called "side slipping", in which electrons accumulated in the charge accumulation layer 225 move to the charge accumulation layer 225 of an adjacent memory cell MC, occurs. As a result, it is necessary to configure the added titanium (Ti) as not more than one atomic layer in a film thickness direction of the charge accumulation layer 225 and pay attention that it does not become a film.

Next, an operation principle of the memory cell MC of the present embodiment will be described.

Figure 19:
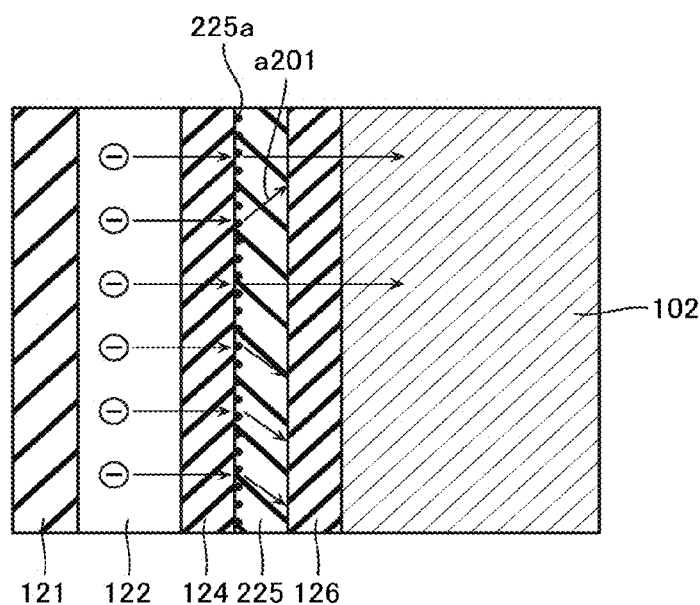
FIG. 19 is a view explaining an operation principle of the memory cell in the nonvolatile semiconductor memory device according to the same embodiment.

FIG. 19 is a view explaining the operation principle of the memory cell in the nonvolatile semiconductor memory device according to the present embodiment.

Some of electrons that have tunneled through the tunnel insulating layer 124 undergo inelastic scattering by titanium (Ti) 225a (arrow a201 of FIG. 19). As a result, energy of the injected electrons is lost and a mean free path in the charge accumulation layer 225 increases. Subsequently, the injected electrons are trapped by an originally existing nitrogen defect site or a defect site occurring at a boundary of titanium (Ti) 225a and silicon nitride ($Si_3N_4$), of the charge accumulation layer 225. In the case of the present embodiment, similarly to in the first embodiment, the mean free path of electrons is lengthened by addition of titanium (Ti), thereby enabling a chance of trapping to be increased. Moreover, contrary to in the first embodiment, a defect site also occurs due to addition of titanium (Ti), hence charge trapping capacity can also be secured.

Next, an effect and a principle thereof, of the memory cell of the present embodiment will be described.

Figure 20:
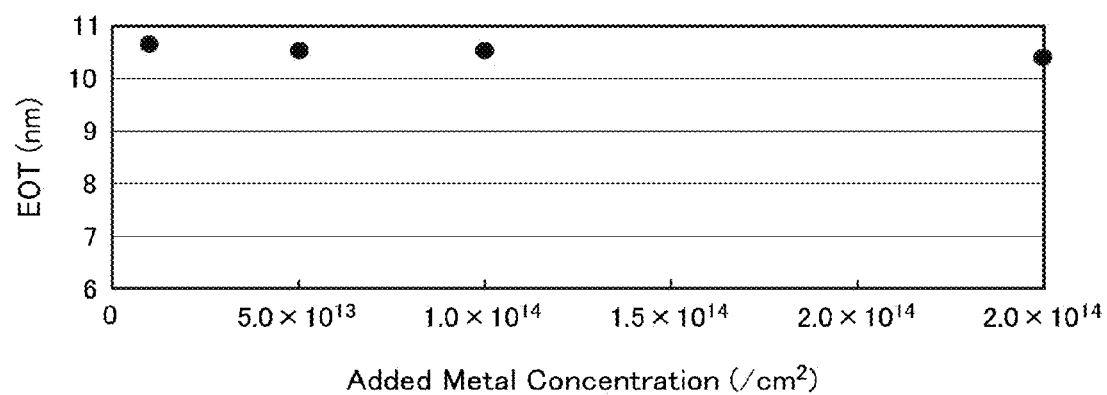
FIG. 20 is a graph showing a relationship of an added metal concentration to the charge accumulation layer and an electrical film thickness of the charge accumulation layer, of the memory cell in the nonvolatile semiconductor memory device according to the same embodiment.

FIG. 20 is a graph showing a relationship of an added metal concentration to the charge accumulation layer and an electrical film thickness of the charge accumulation layer, of the memory cell in the nonvolatile semiconductor memory device according to the present embodiment.

The electrical film thickness (EOT: Equivalent Oxide Thickness) of the charge accumulation layer 225 is clearly substantially constant, regardless of an added amount of titanium (Ti). In other words, even if titanium (Ti) is added, no effect on EOT of the charge accumulation layer 225 is exerted by the added amount of titanium (Ti).

Figure 21:
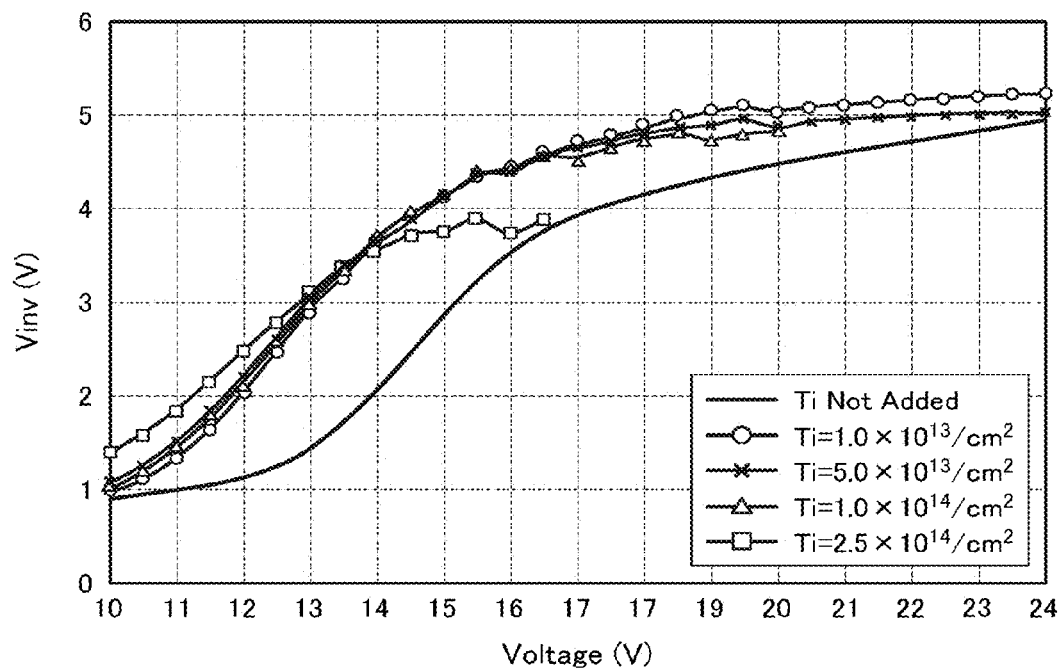
FIG. 21 is a graph showing a relationship of an applied voltage to the charge accumulation layer and a threshold voltage of the charge accumulation layer during data write of the nonvolatile semiconductor memory device according to the same embodiment.
Figure 22:
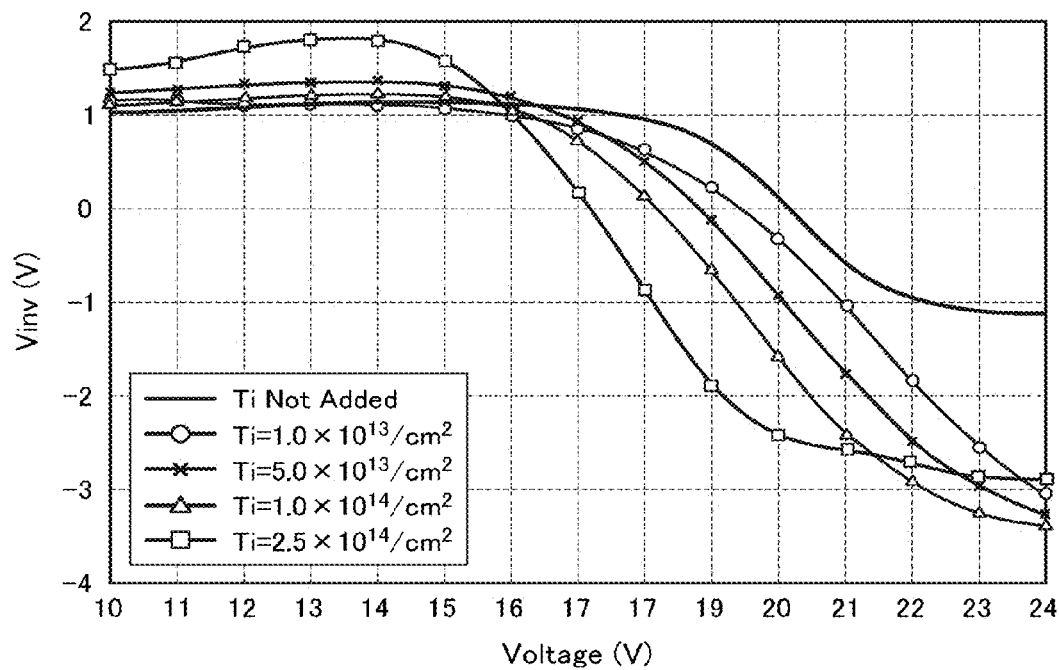
FIG. 22 is a graph showing a relationship of an applied voltage to the charge accumulation layer and a threshold voltage of the charge accumulation layer during data erase of the nonvolatile semiconductor memory device according to the same embodiment.

FIG. 21 is a graph showing a relationship of an applied voltage to the charge accumulation layer and a threshold voltage of the charge accumulation layer during data write of the nonvolatile semiconductor memory device according to the present embodiment. Moreover, FIG. 22 is a graph showing a relationship of an applied voltage to the charge accumulation layer and a threshold voltage of the charge accumulation layer during data erase of the same nonvolatile semiconductor memory device. In these drawings, the horizontal axis indicates the applied voltage to the charge accumulation layer 225, and the vertical axis indicates a threshold voltage Vinv of the charge accumulation layer 225.

As may be understood from FIGS. 21 and 22, write characteristics and erase characteristics are both clearly improved by adding titanium (Ti) to the charge accumulation layer 225. By adding titanium (Ti), a voltage of opening of a write/erase window lowers more and data write and data erase become more high speed than in the case of not adding titanium (Ti). In view of the fact that, as previously mentioned, EOT of the charge accumulation layer 225 is constant, this is considered to be an effect of titanium (Ti) being added and not an effect caused by coupling modulation.

In the case of a memory cell MC employing a MONOS type transistor, it is important during data write that injected electrons to the charge accumulation layer 225 are scattered and trapped in a charge trap in the charge accumulation layer 225. The metal such as titanium (Ti) added in the present embodiment has a larger atomic number and a higher scattering power of electrons than silicon (Si) has. By inserting such a metal, a probability of electrons being scattered rises and the number of electrons penetrating the charge accumulation layer 225 lowers. As a result, the number of electrons trapped in the charge accumulation layer 225 increases, and write speed improves.

On the other hand, an effect during data erase is more prominent than during data write. This is because the following processes, that is, a process in which electrons trapped in the charge accumulation layer 225 during data erase are de-trapped and escape, via the tunnel insulating layer 224, to a side of the semiconductor layer 122 which is a channel, and a process in which holes injected from the semiconductor layer 122 are trapped in the charge accumulation layer 225, become required. Due to the fact that a de-trapping time from the charge accumulation layer 225 shortens by increase in the number of electrons trapped close to an interface with the tunnel insulating layer 224, and to the fact that the number of holes trapped in the charge accumulation layer 225 increases due to increase in the number of scattered holes, erase speed is greatly improved.

However, if an added amount of titanium (Ti) is too large, a breakdown voltage of the charge accumulation layer 225 deteriorates and the write/erase window also lowers, hence the added amount must be set to an optimum amount and is desirably $1 \times 10^{14}/cm^2$ or less, for example.

Next, a modified example of the present embodiment will be described.

Figure 23:
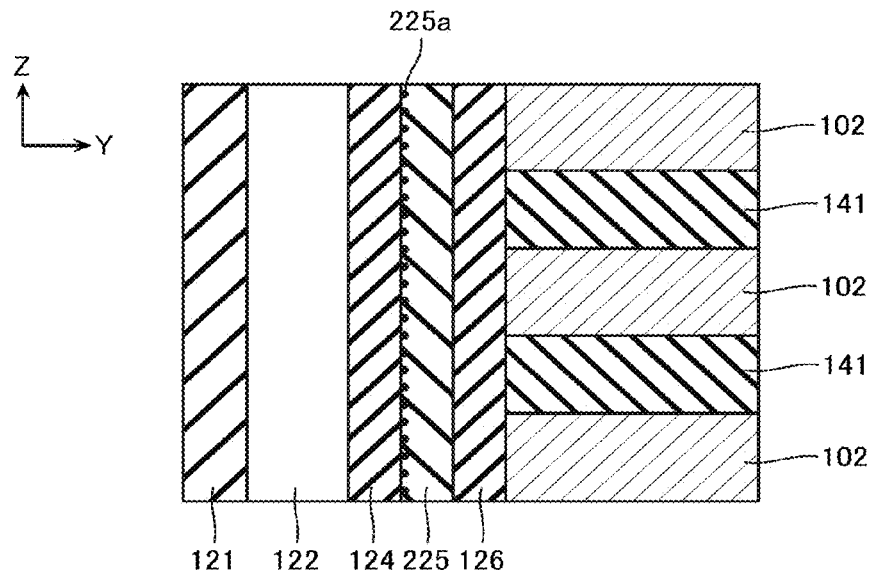
FIG. 23 is a cross-sectional view showing a schematic structure of another memory cell in the nonvolatile semiconductor memory device according to the same embodiment.

FIG. 23 is a cross-sectional view showing a schematic structure of another memory cell in the nonvolatile semiconductor memory device according to the present embodiment.

In the case of this example, titanium (Ti) 225a is added close to the block insulating layer 126, in the charge accumulation layer 225.

Figure 24:
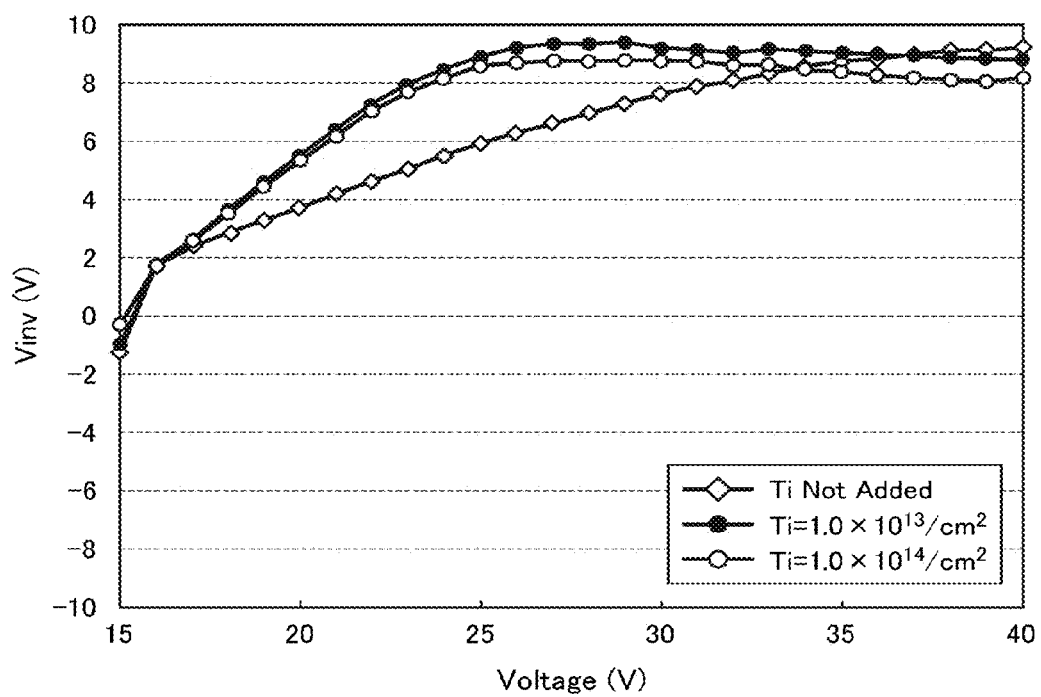
FIG. 24 is a graph showing a relationship of an applied voltage to the charge accumulation layer and a threshold voltage of the charge accumulation layer during data write of the nonvolatile semiconductor memory device according to the same embodiment.
Figure 25:
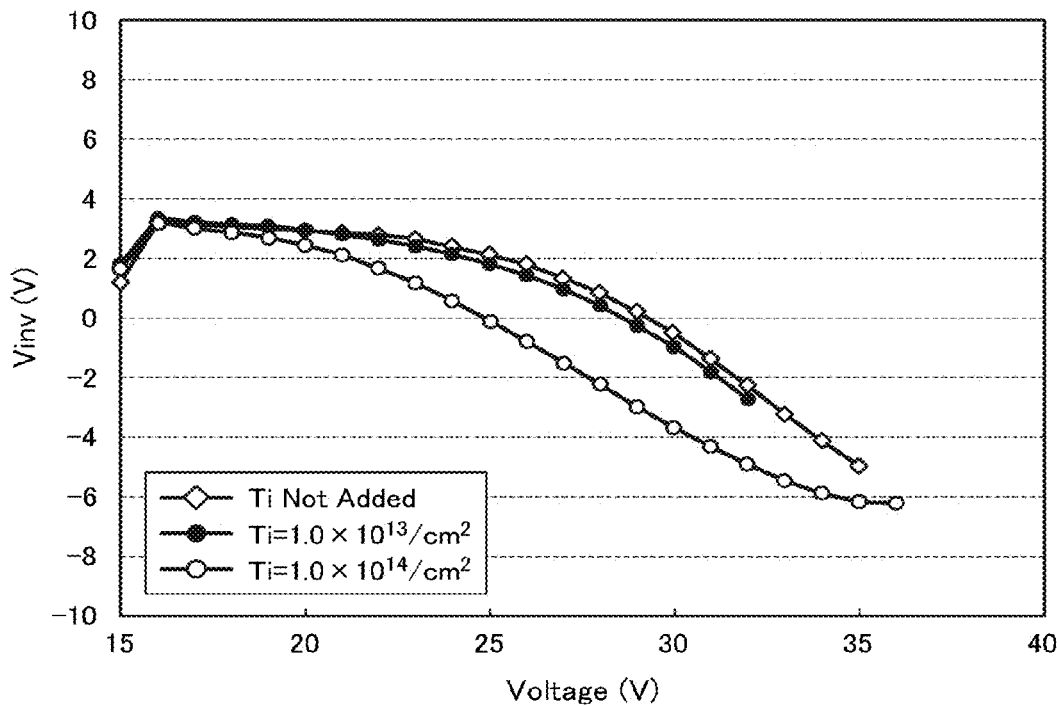
FIG. 25 is a graph showing a relationship of an applied voltage to the charge accumulation layer and a threshold voltage of the charge accumulation layer during data erase of the nonvolatile semiconductor memory device according to the same embodiment.

FIG. 24 is a graph showing a relationship of an applied voltage to the charge accumulation layer and a threshold voltage of the charge accumulation layer during data write of the nonvolatile semiconductor memory device according to the present embodiment; and FIG. 25 is a graph showing a relationship of an applied voltage to the charge accumulation layer and a threshold voltage of the charge accumulation layer during data erase of the same nonvolatile semiconductor memory device. In these drawings, the horizontal axis indicates the applied voltage to the charge accumulation layer 225, and the vertical axis indicates a threshold voltage Vinv of the charge accumulation layer 225.

Regarding data write, as may be understood from FIG. 24, write speed clearly improves to the same extent both when added concentration of titanium (Ti) is $1 \times 10^{13}/cm^2$ and when added concentration of titanium (Ti) is $1 \times 10^{14}/cm^2$. On the other hand, regarding data erase, as may be understood from FIG. 25, although erase speed improves when added concentration of titanium (Ti) is $1 \times 10^{14}/cm^2$, improvement in erase speed is hardly seen when added concentration of titanium (Ti) is $1\times10^{13}/\text{cm}^2$. It is clear from these points that, similarly to in the example of FIG. 17, in order to achieve an improvement in write speed and erase speed, to a certain extent, the metal must be added in high concentration. In view of the graphs shown in FIGS. 24 and 25, a mean surface density of metal that should be added is desirably about $5\times10^{13}$ to $1\times10^{14}/\text{cm}^2$.

Next, charge holding characteristics of the memory cell MC of the present embodiment will be described.

Figure 26:
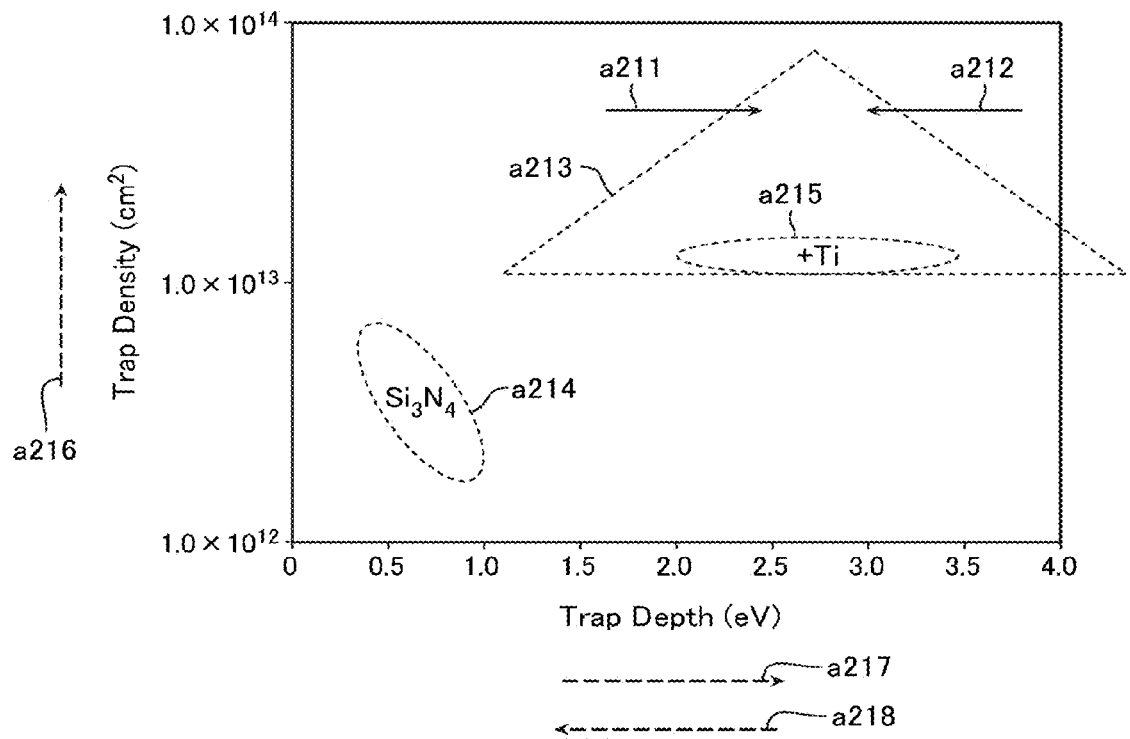
FIG. 26 is a graph showing a relationship of a depth and a density of a charge trap of the charge accumulation layer of the memory cell in the nonvolatile semiconductor memory device according to the same embodiment.

FIG. 26 is a graph showing a relationship of a depth and a density of a charge trap of the charge accumulation layer of the memory cell in the nonvolatile semiconductor memory device according to the present embodiment.

In order to improve charge holding characteristics, there is a need to improve electron holding characteristics and hole holding characteristics. In order to improve electron holding characteristics, the deeper a charge trap is from the conduction band of silicon nitride ($Si_3N_4$), the better (arrow a211 of FIG. 26). On the other hand, in order to improve hole holding characteristics, the shallower a charge trap is from the conduction band of silicon nitride ($Si_3N_4$), the better (arrow a212 of FIG. 26). From the above, considering a balance of the two, the charge trap is desirably around the middle of the forbidden band of silicon nitride ($Si_3N_4$), specifically about 2.7 eV (region a213 surrounded by a broken line of FIG. 26). However, in the case of additive-free silicon nitride ($Si_3N_4$), the depth of the charge trap is clearly only about 0.3 to 0.7 eV (region a214 surrounded by a broken line of FIG. 26). In that respect, when titanium (Ti) is added, a charge trap having a depth of about 2.7 eV is formed (region a215 surrounded by a broken line of FIG. 26). In other words, by adding titanium (Ti) to the charge accumulation layer 225, charge holding characteristics can also be improved.

Note that if density of the charge trap is increased, a write amount of the charge accumulation layer 225 can be further increased (arrow a216 of FIG. 26). Moreover, if depth of the charge trap is increased, side slipping of electrons of the charge accumulation layer 225 can be suppressed (arrow a217 of FIG. 26). Conversely, if depth of the charge trap is reduced, erase characteristics further improve (arrow a218 of FIG. 26).

Next, an addition concentration of titanium (Ti) in the charge accumulation layer 225 will be described.

Figure 27:
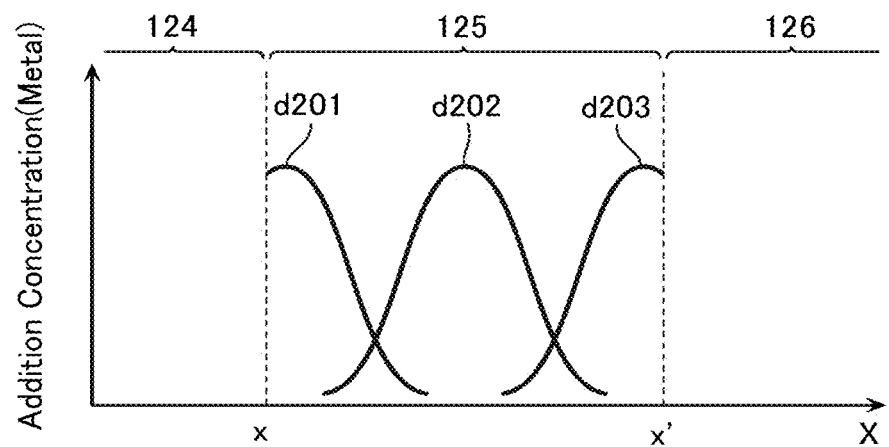
FIG. 27 is a view showing an addition concentration of a metal of the charge accumulation layer of the memory cell in the nonvolatile semiconductor memory device according to the same embodiment.

FIG. 27 is a view showing an addition concentration of the metal of the charge accumulation layer of the memory cell in the nonvolatile semiconductor memory device according to the present embodiment. The symbol x in FIG. 27 indicates a boundary of the tunnel insulating layer 124 and the charge accumulation layer 125; and the symbol x' in FIG. 27 indicates a boundary of the charge accumulation layer 125 and the block insulating layer 126.

When titanium (Ti) exists closely adjacent to the tunnel insulating layer 124 as in the example of FIG. 17 (distribution d201 of FIG. 27), the charge trap is close to the tunnel insulating layer 124, hence a trapping time shortens, hence erase speed can be further increased. Moreover, since titanium (Ti) causing inelastic scattering of the charge accumulation layer 225 and the defect site occurring at a boundary of titanium (Ti) and silicon nitride ($Si_3N_4$) acting as a charge trap, are concentrated close to the tunnel insulating layer 124, a film thickness on a side of the block insulating layer 126, of the charge accumulation layer 225 can be reduced. In other words, film thinning of the charge accumulation layer 225 can be further achieved.

Moreover, when titanium (Ti) exists centrally in a film thickness direction of the charge accumulation layer 225 (distribution d202 of FIG. 27), diffusion of titanium (Ti) to the tunnel insulating layer 124 and the block insulating layer 126 can be suppressed. As a result, deterioration of the tunnel insulating layer 124 and the block insulating layer 126 can be suppressed.

Moreover, when titanium (Ti) exists closely adjacent to the block insulating layer 126 as in the example of FIG. 23 (distribution d203 of FIG. 27), the charge trap is far from the tunnel insulating layer 124, hence it is difficult for trapped electrons to be de-trapped toward the tunnel insulating layer 124. In other words, charge holding characteristics can be further improved.

The present embodiment makes it possible to provide a nonvolatile semiconductor memory device that by utilizing elastic scattering due to an added metal and lengthening a mean free path of injected electrons in a charge accumulation layer, achieves, achieves increased film thinning and increased efficiency of charge trapping of the charge accumulation layer.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the inventions have a form in which the plurality of memory columnar bodies 105 extend in the Z direction, but the inventions may also have the likes of a form in which the memory columnar bodies 105 are doubled back midway to extend in a reverse direction (so-called U-shaped type form), not only a form extending in one direction. Moreover, even in the case of a flash memory having MONOS type transistors acting as memory cells arranged two-dimensionally therein, it is possible that by configuring the structure of its charge accumulation layer as a structure similar to that of the above-described embodiments, an improvement in operation speed of write and erase of the memory cell and an improvement in charge holding characteristics are achieved, similarly to in the above-described embodiments.

What is claimed is:

1. A nonvolatile semiconductor memory device, comprising
   a memory cell,
   the memory cell comprising:
   a semiconductor layer;
   a control gate electrode;
   a charge accumulation layer disposed between the semiconductor layer and the control gate electrode;
   a first insulating layer disposed between the semiconductor layer and the charge accumulation layer; and
   a second insulating layer disposed between the charge accumulation layer and the control gate electrode,
   the charge accumulation layer including an insulator that includes silicon and nitrogen, and the insulator further including: a first element; and a second element different from the first element,
   the insulator having a first part and a second part, the second part being closer to the second insulating layer than the first part, a concentration of the first element of the second part being higher than that of the first part, the first part including the second element, the first element including at least one of hafnium (Hf), zirconium (Zr), tantalum (Ta), niobium (Nb), vanadium (V), tungsten (W), molybdenum (Mo), chromium (Cr), rhenium (Re), manganese (Mn), carbon (C), scandium (Sc), aluminum (Al), and phosphorus (P), and the second element including at least one of ruthenium (Ru), nickel (Ni), rhodium (Rh), osmium (Os), iridium (Ir), platinum (Pt), palladium (Pa), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), yttrium (Y), germanium (Ge), tin (Sn), antimony (Sb), bismuth (Bi), sulfur (S), selenium (Se), tellurium (Te), zinc (Zn), magnesium (Mg), calcium (Ca), strontium (Sr), and barium (Ba).

2. The nonvolatile semiconductor memory device according to claim 1, wherein
the charge accumulation layer includes a first site having a first energy level of a depth of not more than 0.4 eV from a lower end of a conduction band of the insulator.

3. The nonvolatile semiconductor memory device according to claim 1, wherein
the insulator of the charge accumulation layer includes silicon nitride.

4. The nonvolatile semiconductor memory device according to claim 1, wherein
a peak of concentration of the first element of the charge accumulation layer is closer to the second insulating layer than the first insulating layer.

5. The nonvolatile semiconductor memory device according to claim 1, wherein
a peak of concentration of the first element of the charge accumulation layer is in a position different from a boundary of the first insulating layer and the charge accumulation layer and different from a boundary of the charge accumulation layer and the second insulating layer.

6. The nonvolatile semiconductor memory device according to claim 1, wherein
a peak of concentration of the second element of the charge accumulation layer is in a position different from a boundary of the first insulating layer and the charge accumulation layer and different from a boundary of the charge accumulation layer and the second insulating layer.

7. The nonvolatile semiconductor memory device according to claim 1, wherein
the memory cell is disposed on a substrate, and the semiconductor layer comprises a portion extending in a direction intersecting a surface of the substrate.

8. A nonvolatile semiconductor memory device, comprising
a memory cell,
the memory cell comprising:
a semiconductor layer;
a control gate electrode;
a charge accumulation layer disposed between the semiconductor layer and the control gate electrode;
a first insulating layer disposed between the semiconductor layer and the charge accumulation layer; and
a second insulating layer disposed between the charge accumulation layer and the control gate electrode,
the charge accumulation layer including an insulator that includes silicon and nitrogen, and the insulator further including: a first element; and a second element different from the first element,
the insulator having a first part and a second part, the second part being closer to the second insulating layer than the first part, a concentration of the first element of the second part being higher than that of the first part, the first part including the second element,
the first element including at least one of hydrogen (H), fluorine (F), chlorine (Cl), bromine (Br), and iodine (I), and
the second element including at least one of ruthenium (Ru), nickel (Ni), rhodium (Rh), osmium (Os), iridium (Ir), platinum (Pt), palladium (Pa), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), yttrium (Y), germanium (Ge), tin (Sn), antimony (Sb), bismuth (Bi), sulfur (S), selenium (Se), tellurium (Te), zinc (Zn), magnesium (Mg), calcium (Ca), strontium (Sr), and barium (Ba).

9. The nonvolatile semiconductor memory device according to claim 8, wherein
the charge accumulation layer includes a first site having a first energy level of a depth of not more than 0.4 eV from a lower end of a conduction band of the insulator.

10. The nonvolatile semiconductor memory device according to claim 8, wherein
the insulator of the charge accumulation layer includes silicon nitride.

11. The nonvolatile semiconductor memory device according to claim 8, wherein
a peak of concentration of the first element of the charge accumulation layer is closer to the second insulating layer than the first insulating layer.

12. The nonvolatile semiconductor memory device according to claim 8, wherein
a peak of concentration of the first element of the charge accumulation layer is in a position different from a boundary of the first insulating layer and the charge accumulation layer and different from a boundary of the charge accumulation layer and the second insulating layer.

13. The nonvolatile semiconductor memory device according to claim 8, wherein
a peak of concentration of the second element of the charge accumulation layer is in a position different from a boundary of the first insulating layer and the charge accumulation layer and different from a boundary of the charge accumulation layer and the second insulating layer.

14. The nonvolatile semiconductor memory device according to claim 8, wherein
the memory cell is disposed on a substrate, and the semiconductor layer comprises a portion extending in a direction intersecting a surface of the substrate.

* * * * *